(12) United States Patent
Shin

(10) Patent No.: US 12,262,105 B2
(45) Date of Patent: Mar. 25, 2025

(54) CAMERA MODULE

(71) Applicant: LG INNOTEK CO., LTD., Seoul (KR)

(72) Inventor: Won Seob Shin, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 84 days.

(21) Appl. No.: 18/259,713

(22) PCT Filed: Dec. 28, 2021

(86) PCT No.: PCT/KR2021/020025
§ 371 (c)(1),
(2) Date: Jun. 28, 2023

(87) PCT Pub. No.: WO2022/145955
PCT Pub. Date: Jul. 7, 2022

(65) Prior Publication Data
US 2024/0064393 A1    Feb. 22, 2024

(30) Foreign Application Priority Data
Dec. 28, 2020    (KR) .................. 10-2020-0184355

(51) Int. Cl.
H04N 23/52    (2023.01)
H04N 23/54    (2023.01)
(Continued)

(52) U.S. Cl.
CPC ............. *H04N 23/52* (2023.01); *H04N 23/54* (2023.01); *H04N 23/63* (2023.01); *H04N 25/702* (2023.01)

(58) Field of Classification Search
CPC ........ H04N 23/52; H04N 23/54; H04N 23/63; H04N 25/702; H04N 23/57; H05K 1/11; H05K 1/18; H05K 1/111; H05K 1/181
See application file for complete search history.

(56) References Cited

U.S. PATENT DOCUMENTS 10,680,025 B2 *  6/2020  Shim ................... H01L 27/1469
2014/0061841 A1  3/2014  Kim et al.
(Continued)

FOREIGN PATENT DOCUMENTS

JP    2017-183386 A    10/2017
KR    20-2009-0004352 U    5/2009
(Continued)

OTHER PUBLICATIONS

International Search Report dated May 2, 2022 in International Application No. PCT/KR2021/020025.

*Primary Examiner* — Padma Haliyur
(74) *Attorney, Agent, or Firm* — Saliwanchik, Lloyd & Eisenschenk

(57) ABSTRACT

A camera module according to an embodiment includes a circuit board; and an image sensor disposed on the circuit board; wherein the circuit board includes: an insulating layer; a pad disposed on the insulating layer; a terminal disposed on the insulating layer and spaced apart from the pad; a protective layer disposed on the insulating layer and including an opening exposing the pad and the terminal; a wire part disposed on the pad; and a connecting wire connecting the image sensor and the terminal, wherein a lower surface of the image sensor is in direct contact with the wire part, and wherein the wire part and the image sensor are electrically separated from each other.

20 Claims, 16 Drawing Sheets

(51) Int. Cl.
*H04N 23/63* (2023.01)
*H04N 25/702* (2023.01)

(56) References Cited

U.S. PATENT DOCUMENTS

| | | | |
|---|---|---|---|
| 2015/0264806 A1* | 9/2015 | Happoya | H05K 3/38 174/251 |
| 2019/0174087 A1 | 6/2019 | Kim et al. | |
| 2020/0365559 A1* | 11/2020 | Hwang | H01L 23/3121 |
| 2021/0281756 A1* | 9/2021 | Park | H05K 1/0278 |
| 2022/0115426 A1* | 4/2022 | Son | H04N 23/54 |
| 2022/0353396 A1* | 11/2022 | Kim | G03B 5/00 |

FOREIGN PATENT DOCUMENTS

| | | | | |
|---|---|---|---|---|
| KR | 10-2010-0108702 A | 10/2010 | | |
| KR | 10-2012-0130993 A | 12/2012 | | |
| KR | 10-2014-0028700 A | 3/2014 | | |
| KR | 10-2019-0066196 A | 6/2019 | | |
| WO | WO-2019182307 A1 * | 9/2019 | | G02B 27/646 |

* cited by examiner (a)

(b)

(c)

FIG. 14(a)
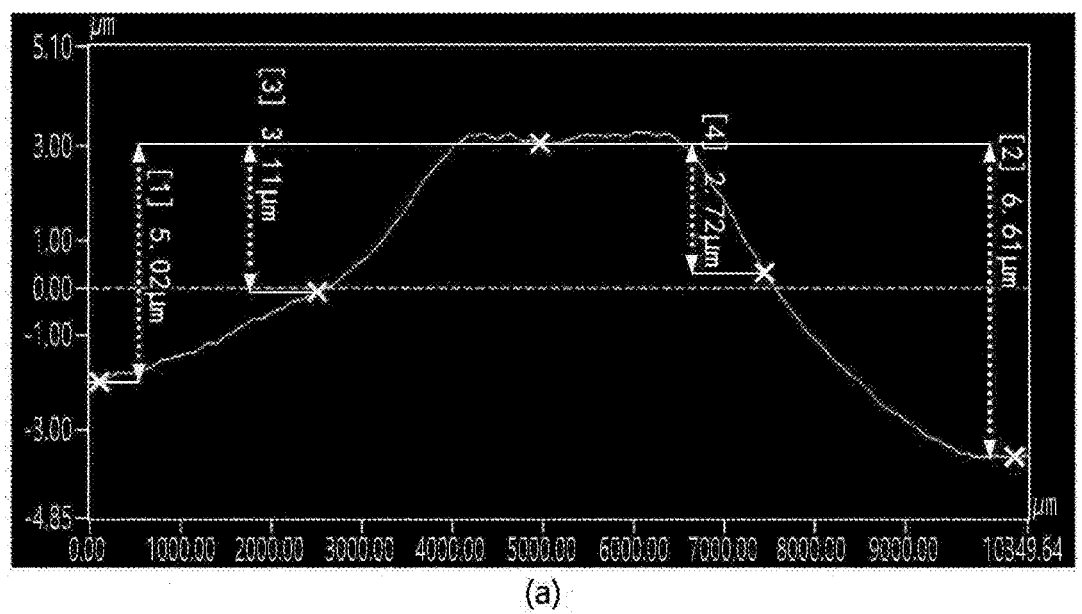
(a)
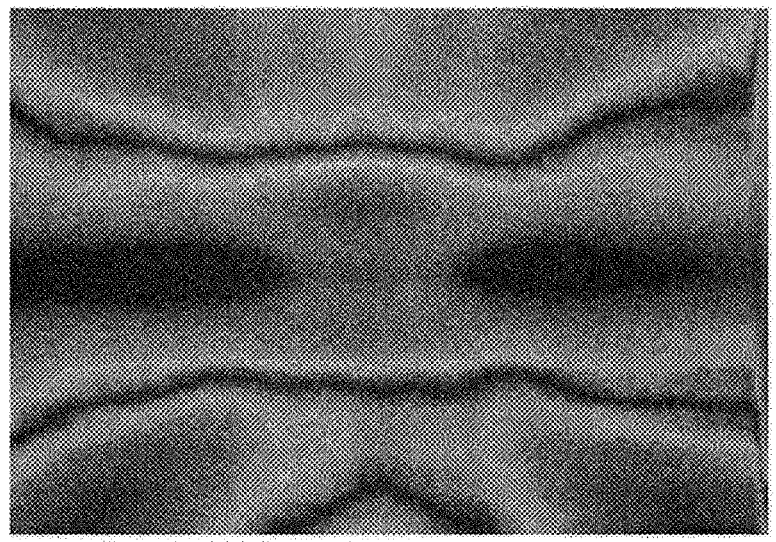
(b)
FIG. 14(b)

FIG. 15(a)
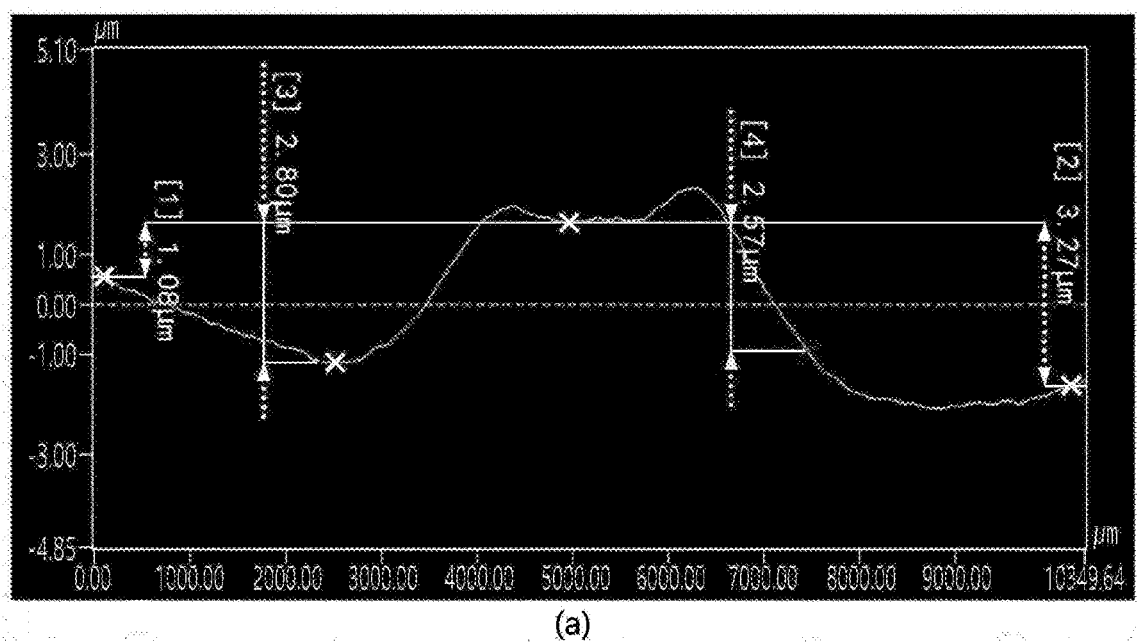
(a)
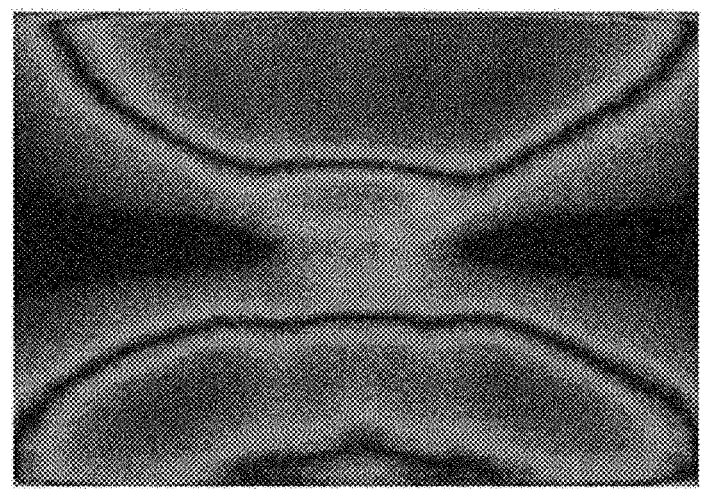
(b)
FIG. 15(b)

CAMERA MODULE

CROSS-REFERENCE TO RELATED APPLICATIONS

This application is the U.S. national stage application of International Patent Application No. PCT/KR2021/020025, filed Dec. 28, 2021, which claims the benefit under 35 U.S.C. § 119 of Korean Application No. 10-2020-0184355, filed Dec. 28, 2020, the disclosures of each of which are incorporated herein by reference in their entirety.

TECHNICAL FIELD

An embodiment relates to a camera module and an optical device including the same.

BACKGROUND ART

Recently, miniature camera modules have been developed, and the miniature camera modules are widely used in small electronic products such as smart phones, notebook computers, and game devices.

That is, most mobile electronic devices, including smartphones, are equipped with a camera device for obtaining an image from an object, and the mobile electronic devices are gradually becoming smaller for easy portability.

Such a camera device generally may include a lens through which light is incident, an image sensor that captures light incident through the lens, and a plurality of components for transmitting and receiving electrical signals for images obtained from the image sensor to an electronic device equipped with a camera device. In addition, these image sensors and components are generally mounted on a printed circuit board and connected to an external electronic device.

On the other hand, the conventional camera device uses a printed circuit board so that the image sensor is located at a high position. However, when the image sensor is directly mounted on the printed circuit board as described above, there is a problem in that heat generated from the image sensor is not emitted, and thus there is a reliability problem due to heat generation. Recently, the pixels or size of image sensors are increasing for high resolution, and thus the heat problem of the image sensor further affects the performance of the camera device.

In addition, a printed circuit board in a conventional camera device is disposed on a reinforcing plate such as a stiffener, and the image sensor is disposed on the reinforcing plate, and then is connected to the printed circuit board through wire bonding. At this time, a cavity exposing a surface of the reinforcing plate is formed in the printed circuit board. In this case, when the cavity type printed circuit board and the reinforcing plate are used, the heat dissipation problem can be solved while increasing the height of the image sensor. In such a camera device, an epoxy for bonding an image sensor is applied on the reinforcing plate, and the image sensor is disposed on the applied epoxy. However, the camera device as described above has a problem in that warpage occurs due to a difference between a coefficient of thermal expansion of the image sensor, a coefficient of thermal expansion of the printed circuit board, and a coefficient of thermal expansion of the epoxy. For example, thermal curing proceeds in a state in which an image sensor is disposed on the epoxy. At this time, when the thermal curing proceeds, the configuration including the reinforcing plate, the epoxy and the image sensor is heat-expanded and then contracted, and accordingly, there is a problem that the warpage phenomenon occurs severely in a shape like '∩'. In addition, when the warpage phenomenon of the image sensor occurs, there is a problem in that the resolution performance of the camera device is deteriorated, and thus the yield of the camera device is decreased.

Accordingly, there is a need for a method capable of minimizing the warpage of the image sensor.

DISCLOSURE

Technical Problem

An embodiment is to provide a camera module capable of minimizing the warpage phenomenon of an image sensor and an optical device including the same.

In addition, the embodiment is to provide a camera module including an image sensor supported by a wire and an optical device including the same.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A camera module according to an embodiment includes a circuit board, and an image sensor disposed on the circuit board; wherein the circuit board includes: an insulating layer; a pad disposed on the insulating layer; a terminal disposed on the insulating layer and spaced apart from the pad; a protective layer disposed on the insulating layer and including an opening exposing the pad and the terminal, a wire part disposed on the pad; and a connecting wire connecting the image sensor and the terminal, wherein a lower surface of the image sensor is in direct contact with the wire part, and wherein the wire part and the image sensor are electrically separated from each other.

In addition, the camera module further includes a first adhesive member disposed between the protective layer and the image sensor.

In addition, the first adhesive member is spaced apart from the wire part.

In addition, an area of a lower surface of the image sensor is greater than an area of the first adhesive member.

In addition, an area of the first adhesive member is 50% or less of the area of the lower surface of the image sensor.

In addition, the pad includes a plurality of pads spaced apart from each other, wherein the wire part includes a plurality of sub wire parts disposed on each of the plurality of pads, and wherein the first adhesive member is disposed in a space between the plurality of sub wire parts.

In addition, the plurality of sub wire parts are overlapped a corner region of a lower surface of the image sensor in an optical axis direction.

In addition, the image sensor includes a pixel region and a passivation region around the pixel region; and wherein the wire part overlaps a lower surface of the pixel region of the image sensor in an optical axis direction.

In addition, the pixel region of the image sensor includes: an active pixel region; and a dummy pixel region between the active pixel region and the passivation region; and wherein the wire part overlaps a corner region of the active pixel region in the optical axis direction.

In addition, the wire part includes: a bump portion bonded on the pad; a first extension portion extending from the bump portion in an optical axis direction; a second extension portion extending from the first extension portion in a direction perpendicular to the optical axis direction and in direct contact with a lower surface of the image sensor; and a third extension portion extending from the second extension portion and bonded to the pad.

In addition, a width of the bump portion has a range between 80 um to 100 um, and a height of the bump portion has a range between 10 um to 30 um.

In addition, a height from a lower surface of the bump portion to an uppermost end of the second extension portion has a range of 30 um to 50 um.

In addition, a length of the second extension has a range of 10 um to 30 um.

In addition, one end and the other end of the wire part are in contact with the pad, and one end of the connecting wire is in contact with the terminal of the image sensor, and the other end of the connecting wire is in contact with the terminal of the circuit board.

Effects of the Invention

An embodiment includes a circuit board including a wire part. The circuit board is a board on which the image sensor is mounted. In this case, the wire part includes a pad disposed on a first region overlapping the image sensor in the optical axis direction, and a terminal disposed on a second region not overlapping the image sensor in the optical axis direction. And, the wire part is bonded on the pad. In addition, the first region includes a region in which an adhesive member is disposed for attaching or fixing the image sensor. That is, the adhesive member may be selectively disposed on a region in which the wire part is not formed among the first region of the circuit board. In an embodiment, at least a part of the lower surface of the image sensor may be attached or fixed to the circuit board by the adhesive member in a state in which at least a part of the image sensor is in direct contact with and supported by the wire part. In this case, the wire part is not electrically connected to (or separated from) the image sensor. That is, the wire part is not a wire having an electrical signal transmission function, but a wire having a supporting function for supporting the image sensor. Accordingly, at least a part of the image sensor in the embodiment may be in direct contact with and supported by the wire part, thereby minimizing the warpage phenomenon of the image sensor. In addition, heat generated from the image sensor in an embodiment may be efficiently transferred to an outside by allowing at least a part of the image sensor to directly contact the wire part.

In addition, an area of an adhesive member disposed on the lower surface of the image sensor in the embodiment is smaller than an area of the lower surface of the image sensor. According to this, an arrangement area of the adhesive member in the embodiment is reduced compared to the area of the image sensor, and accordingly, the warpage phenomenon of the image sensor, which increases in proportion to the area of the adhesive member, can be minimized.

In addition, a corner region of a lower surface of an active pixel region of the image sensor and the wire part are in direct contact with each other. Accordingly, the embodiment may solve the problem of warping of the active pixel region of the image sensor.

DESCRIPTION OF DRAWINGS

FIGS. 14(a) and 14(b) are graphs showing a degree of warpage of an image sensor according to a comparative example.

FIGS. 15(a) and 15(b) are graphs showing a degree of warpage of an image sensor including a wire part according to an embodiment.

BEST MODE

Figure 1:
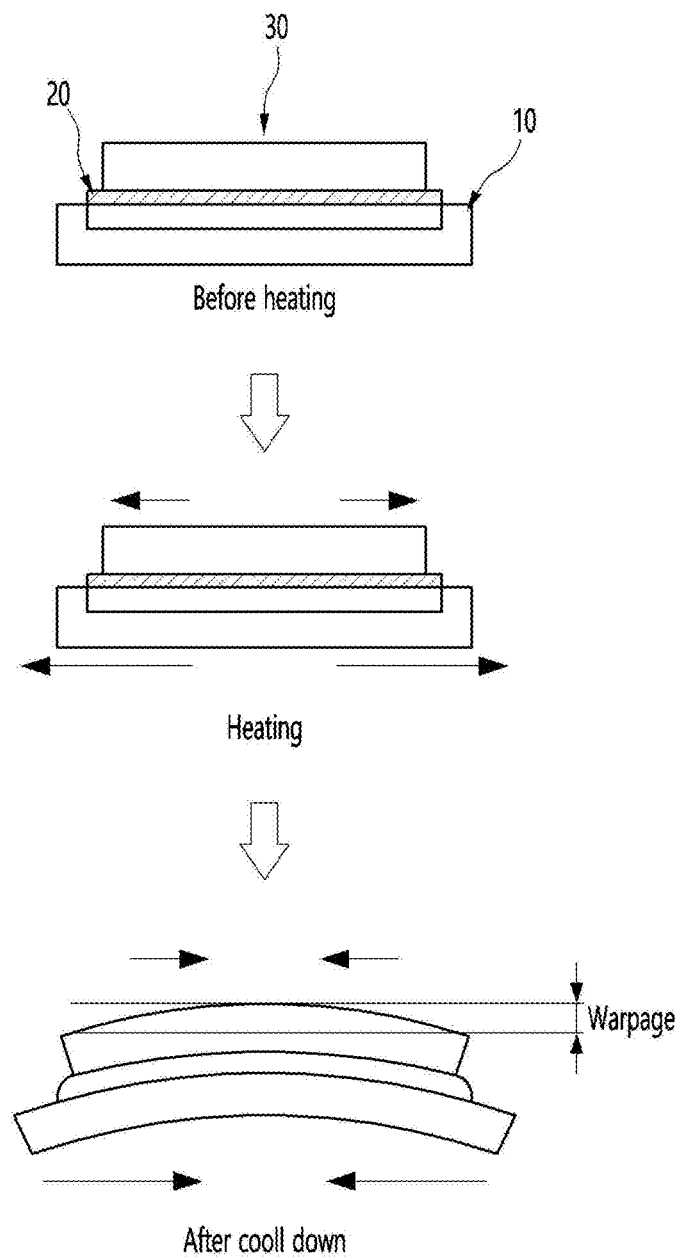
FIG. 1 is a view for explaining a warpage phenomenon of a camera module of a comparative example.

Hereinafter, embodiments of the present invention will be described in detail with reference to the accompanying drawings.

However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art. Further, the terms used in the embodiments of the present invention are for describing the embodiments and are not intended to limit the present invention.

In this specification, the singular forms may also include the plural forms unless specifically stated in the phrase, and may include at least one of all combinations that may be combined in A, B, and C when described in "at least one (or more) of A (and), B, and C". Further, in describing the elements of the embodiments of the present invention, the terms such as first, second, A, B, (A, and (b) may be used.

These terms are only used to distinguish the elements from other elements, and the terms are not limited to the essence, order, or order of the elements. In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements. Further, when expressed as "on (over)" or "under (below)", it may include not only the upper direction but also the lower direction based on one element.

An optical axis direction used below is defined as an optical axis direction of a camera actuator and a lens coupled to a camera module, and a vertical direction may be defined as a direction perpendicular to the optical axis.

"Auto focus function" used below is defined as a function for automatically adjusting a focus on a subject by adjusting a distance from an image sensor and moving a lens in the optical axis direction according to the distance of the subject so that a clear image of the subject may be obtained on the image sensor.

Meanwhile, "auto focus" may correspond to "AF (Auto Focus)". In addition, Closed-loop auto focus (CLAF) control may be defined as real-time feedback control of the lens position by sensing the distance between the image sensor and the lens to improve focus adjustment accuracy.

In addition, before a description of an embodiment of the present invention, a first direction may mean a x-axis direction shown in drawings, and a second direction may be a different direction from the first direction. For example, the second direction may mean a y-axis direction shown in the drawing in a direction perpendicular to the first direction. Also, a third direction may be different from the first and second directions. For example, the third direction may mean a z-axis direction shown in the drawing in a direction perpendicular to the first and second directions. Here, the third direction may mean an optical axis direction.

Hereinafter, a structure in a comparative example and problems thereof will be described before describing embodiments of the present application.

FIG. 1 is a view for explaining a warpage phenomenon of a camera module of a comparative example.

Referring to FIG. 1, the camera module of a comparative example has a structure including a reinforcing plate 10, an adhesive member 20 and an image sensor 30. The image sensor 30 is a sensor die constituting a sensor chip, and may generally be a silicon (Si) die.

At this time, the reinforcing plate 10, the adhesive member 20 and the image sensor 30 (specifically, the silicon die) have different coefficients of thermal expansion (CTE). Here, the coefficient of thermal expansion means a change in length by a unit*temperature change for a unit*length.

In the camera module of the comparative example as described above, a thermal curing process is performed in a state in which the adhesive member 20 is disposed on the reinforcing plate 10 and the image sensor 30 is disposed on the adhesive member 20. In addition, the image sensor 30 is attached to the reinforcing plate 10 by the thermosetting process.

At this time, as in a top view of FIG. 1, it can be seen that warpage does not occur when the reinforcing plate 10, the adhesive member 20, and the image sensor 30 are sequentially stacked before heating.

And, as in a middle view of FIG. 1, when heat is applied to proceed with the thermal curing, the reinforcing plate 10, both ends of each of the adhesive member 20, and the image sensor 30 are expand in a longitudinal direction away from each other.

And, as in a bottom view of FIG. 1, when the thermal curing process is terminated and the cooling process proceeds (after cool down), each of the expanded reinforcing plate 10, the adhesive member 20 and the image sensor 30 is contracted to a state before expansion.

At this time, the reinforcing plate 10, the adhesive member 20 and the image sensor 30 have different coefficients of thermal expansion. The coefficient of thermal expansion of each configuration is shown in Table 1 below.

TABLE 1

| Material | CTE $(((10\text{-}6 \text{ m}/(m° \text{ C.}))$ |
| --- | --- |
| Silicon (image sensor die) | 3~5 |
| Epoxy (adhesive member) | 45~65 |
| Copper Alloys (reinforcing plate) | 17.6 |

As described above, the reinforcing plate 10, the adhesive member 20 and the image sensor 30 have different coefficients of thermal expansion. Accordingly, when the expansion and contraction according to the thermal curing proceed, a difference occurs in the degree of contraction due to the difference in the coefficient of thermal expansion, and accordingly, a warpage occurs in the shape of '∩'.

In addition, when the warpage phenomenon of the image sensor occurs, there is a problem in that the resolution performance of the camera device is deteriorated, and thus the yield of the camera device is decreased.

Accordingly, the embodiment minimizes the warpage that occurs due to the difference in the coefficient of thermal expansion between the reinforcing plate 10, the image sensor 30 and the adhesive member 20, and accordingly, it is possible to improve the performance of the camera device.

Figure 2:
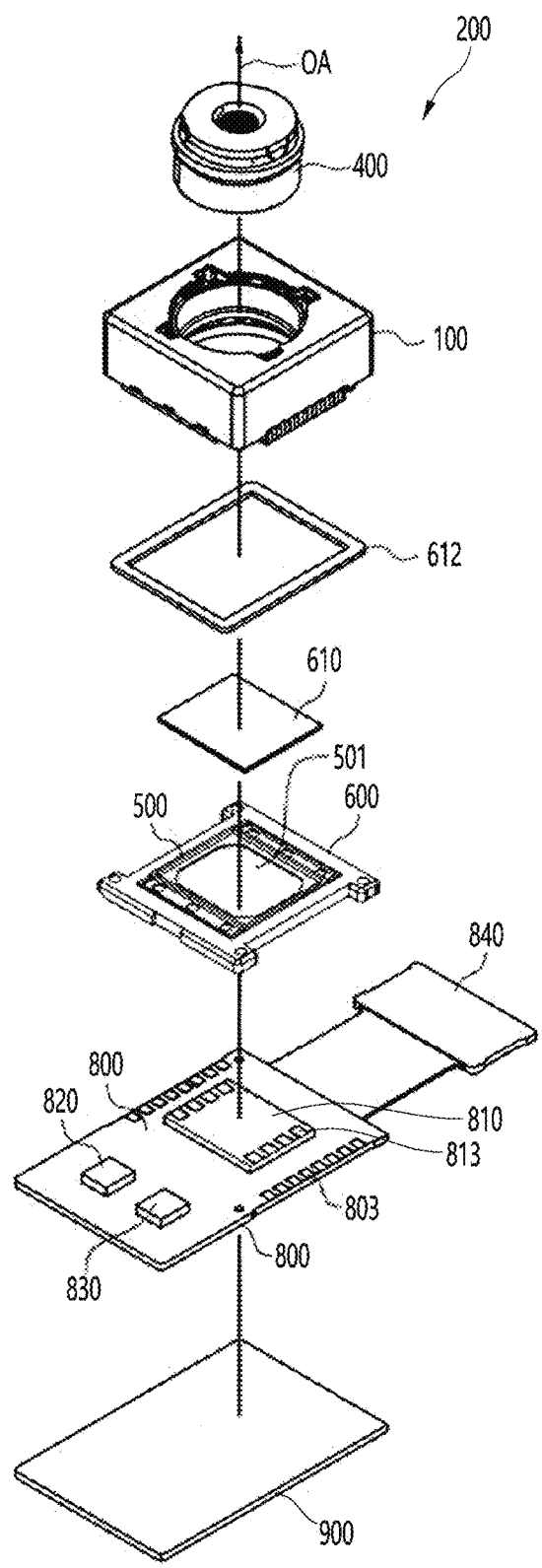
FIG. 2 is an exploded perspective view of a camera module according to an embodiment.
Figure 3:
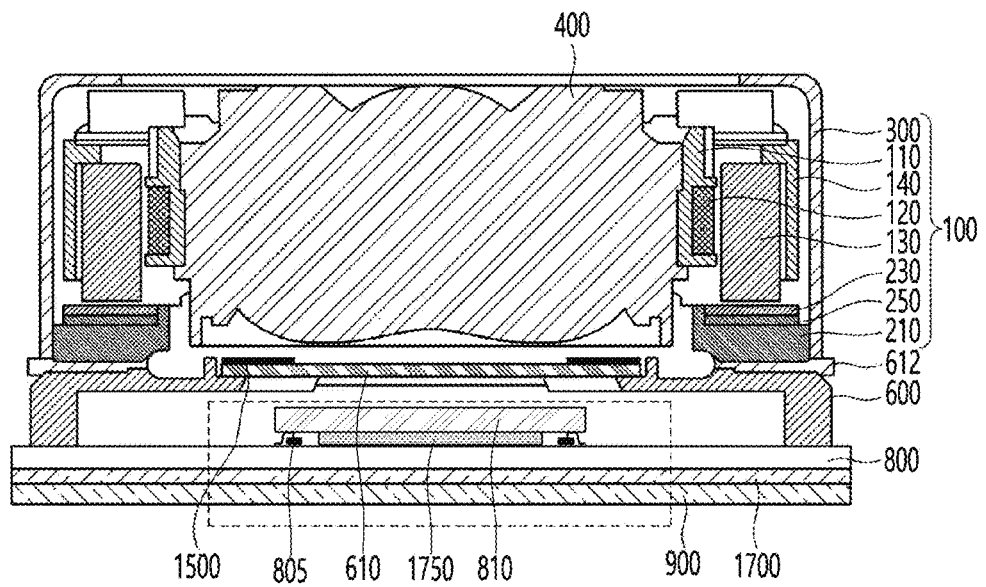
FIG. 3 is a cross-sectional view of the camera module of FIG. 1 according to an embodiment.
Figure 4:
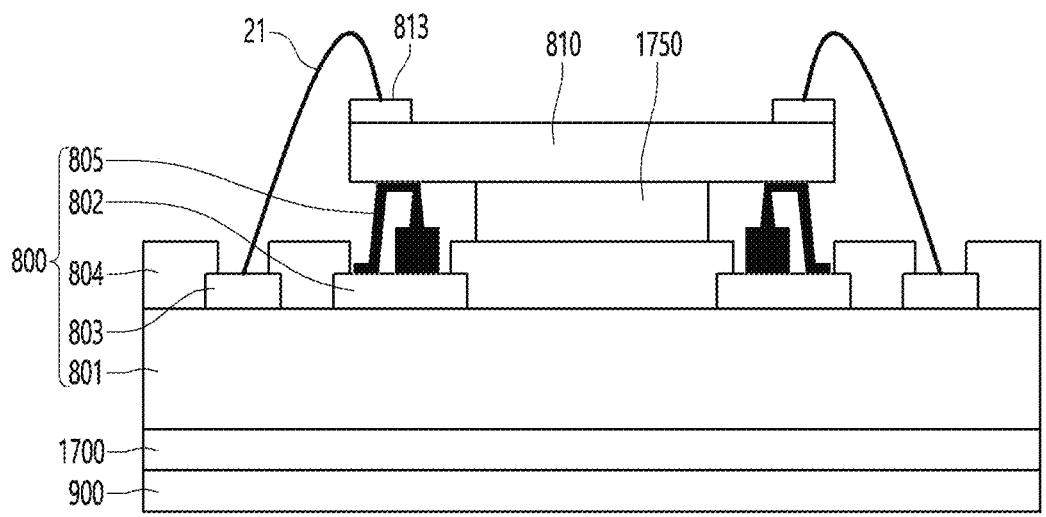
FIG. 4 is an enlarged view of the dotted line portion of FIG. 3.
Figure 5:
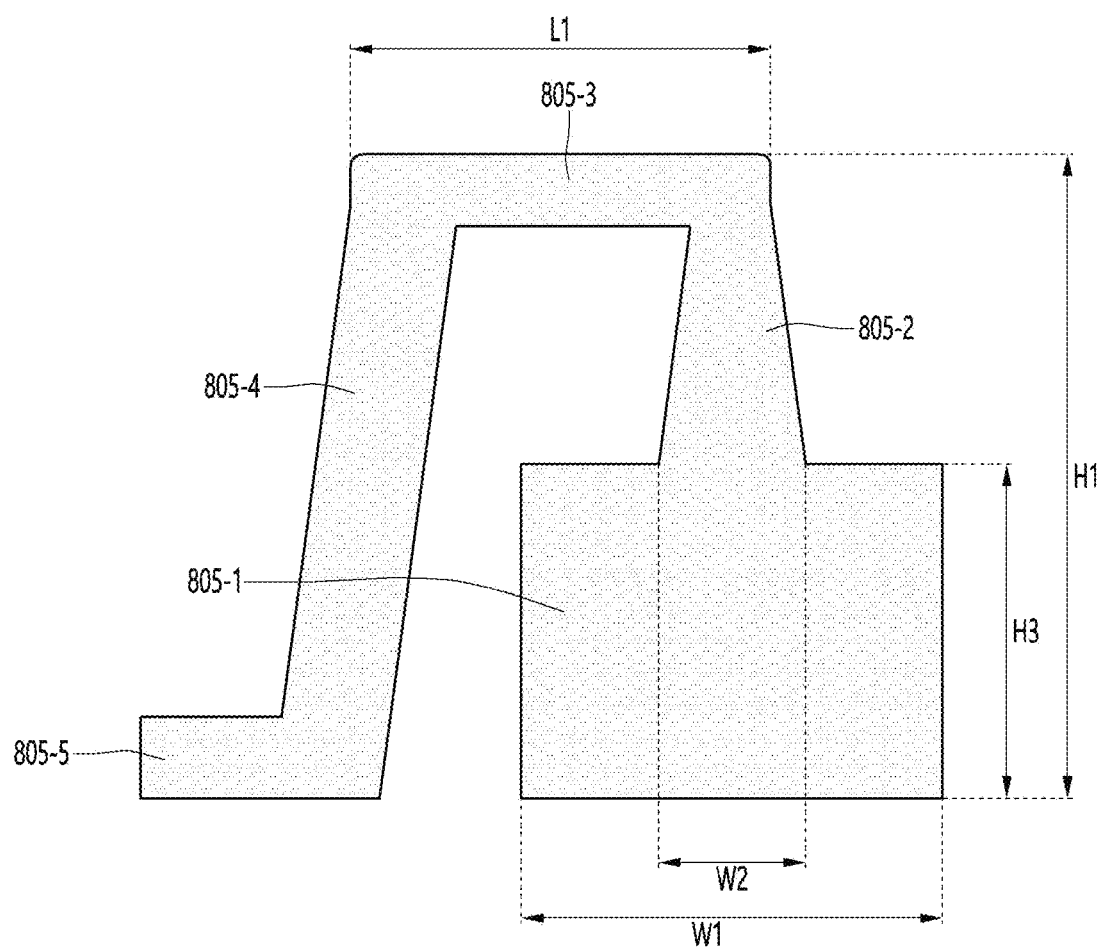
FIG. 5 is an enlarged view of a wire part according to a first embodiment.
Figure 6:
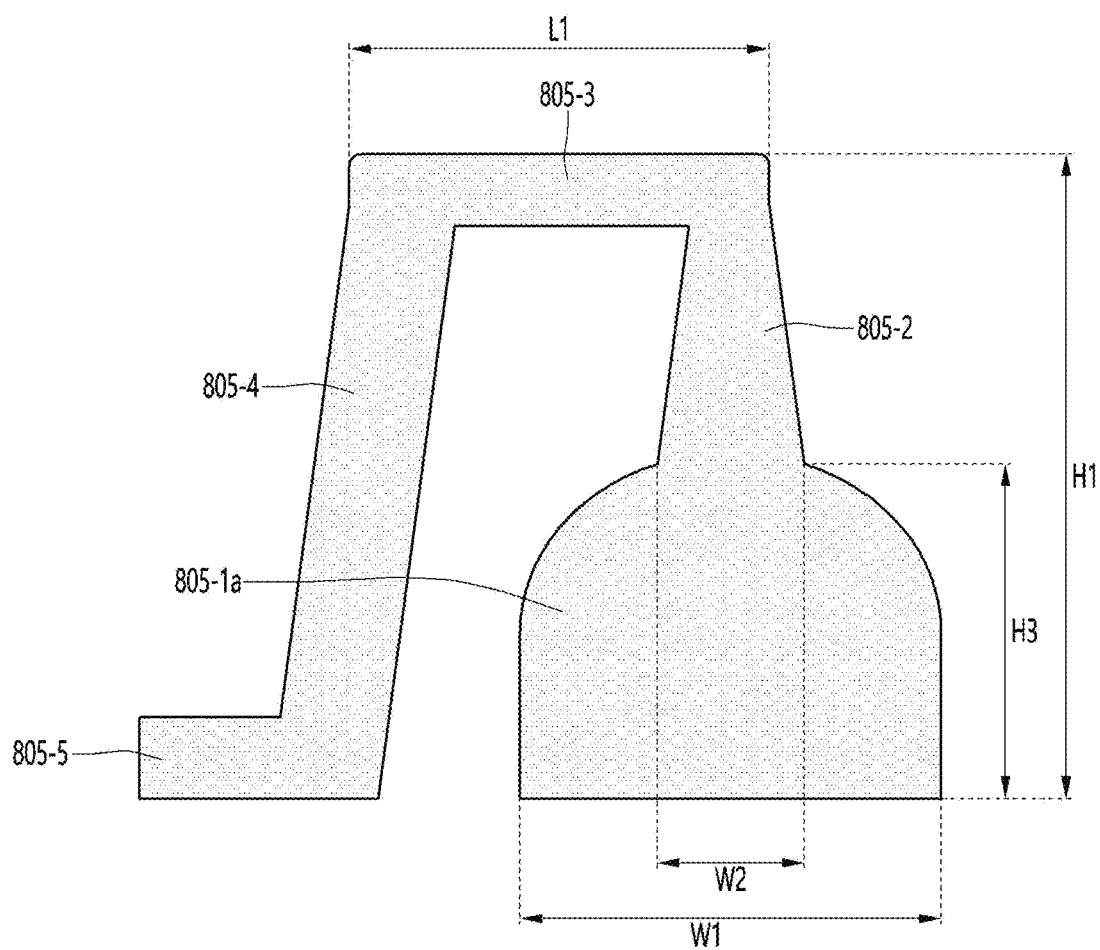
FIG. 6 is an enlarged view of a wire part according to a second embodiment.

FIG. 2 is an exploded perspective view of a camera module according to an embodiment, FIG. 3 is a cross-sectional view of the camera module of FIG. 1 according to an embodiment, FIG. 4 is an enlarged view of the dotted line portion of FIG. 3, FIG. 5 is an enlarged view of a wire part according to a first embodiment, and FIG. 6 is an enlarged view of a wire part according to a second embodiment.

Referring to FIGS. 2 to 6, the camera module 200 may include a lens or lens barrel 400, a lens driving device 100, a filter 610, a holder 600, a circuit board 800, a reinforcing plate 900 and an image sensor 810. Here, "camera module" may be expressed by replacing "capturing device" or "photographer", and the holder 600 may be expressed by replacing "sensor base".

In addition, the camera module 200 may further include a blocking member 1500 disposed on the filter 610.

In addition, the camera module 300 may further include a third adhesive member 612.

In addition, the camera module 300 may further include a motion sensor 820, a control unit 830, and a connector 840.

A lens or a lens barrel 400 may be mounted on a bobbin 110 of the lens driving device 100.

The lens driving device 100 may drive a lens or a lens barrel 400

The camera module 200 may be any one of a camera module for Auto Focus (AF) and a camera module for Optical Image Stabilizer (OIS). A camera module for AF refers to a thing capable of performing only an autofocus function, and an OIS camera module refers to a thing capable of performing an autofocus function and an OIS (Optical Image Stabilizer) function.

For example, the lens driving device 100 may be a lens driving device for AF or a lens driving device for OIS, where "for AF" and "for OIS" mean a camera module for AF and a camera module for OIS may be the same as described above.

For example, the lens driving device 100 of the camera module 200 may be a lens driving device for OIS.

The lens driving device 100 may include a housing 140, a bobbin 110 disposed in the housing 140 and for mounting a lens or lens barrel 400, a first coil 120 disposed on the bobbin 110, a magnet 130 disposed in the housing 140 and facing the first coil 120, at least one upper elastic member (not shown) coupled to an upper portion of the bobbin 110 and an upper portion of the housing 140, at least one lower elastic member (not shown) coupled to a lower portion of the bobbin 110 and a lower portion of the housing 140, a second coil 230 disposed under the bobbin 110 (or/and housing 140), a circuit board 250 disposed under the second coil 230; and a base 210 disposed under the circuit board 250.

In addition, the lens driving device 100 may further includes a cover member 300 coupled to the base 210 and providing a space for accommodating components of the lens driving device 100 together with the base 210.

Also, the lens driving device 100 may further include a support member (not shown) that electrically connects the circuit board 250 and the upper elastic member and supports the housing 140 with respect to the base 210. Each of the first coil 120 and the second coil 230 may be electrically connected to the circuit board 250 and receive a driving signal (driving current) from the circuit board 250.

For example, the upper elastic member may include a plurality of upper springs, and the support member may include support members connected to the upper springs, and the first coil 120 may be electrically connected to the circuit board 250 through the upper springs and the support member. The circuit board 250 may include a plurality of terminals, and a part of the plurality of terminals may be electrically connected to each of the first coil 120 and/or the second coil 230.

The bobbin 110 and the lens or lens barrel 400 coupled thereto may be moved in the optical axis direction by the electromagnetic force due to the interaction between the first coil 120 and the magnet 130, as a result, a displacement of the bobbin 110 is controlled in the optical axis direction, so that AF driving can be implemented.

In addition, the housing 140 may be moved in a direction perpendicular to the optical axis by the electromagnetic force due to the interaction between the second coil 230 and the magnet 130, as a result, image stabilization or OIS driving may be implemented.

In addition, the lens driving device 100 of the camera module 200 may further include a sensing magnet (not shown) disposed on the bobbin 110 and an AF position sensor (e.g., a hall sensor, not shown) disposed on the housing 140 for AF feedback driving. Also, the lens driving device 100 may further include a circuit board (not shown) disposed on the housing and/or the base and on which the AF position sensor is disposed or mounted. In another embodiment, the AF position sensor may be disposed on the bobbin, and the sensing magnet may be disposed on the housing. In addition, the lens driving device 100 may further include a balancing magnet disposed on the bobbin 110 to correspond to the sensing magnet.

The AF position sensor may output an output signal according to a result of detecting the strength of the magnetic field of the sensing magnet according to a movement of the bobbin 100. The AF position sensor may be electrically connected to the circuit board 250 through the upper elastic member (or lower elastic member) and/or the supporting member. The circuit board 250 may provide a driving signal to the AF position sensor, and an output of the AF position sensor may be transmitted to the circuit board 250.

In another embodiment, the lens driving device 100 may be a lens driving device for AF, and the AF lens driving device may include a housing, a bobbin disposed inside the housing, a coil disposed on the bobbin, a magnet disposed on the housing, at least one elastic member coupled to the bobbin and the housing, and a base disposed under the bobbin (or/and the housing).

For example, the elastic member may include the above-described upper elastic member and the lower elastic member.

A driving signal (e.g., a driving current) may be provided to the coil, and the bobbin may be moved in the optical axis direction by electromagnetic force due to the interaction between the coil and the magnet.

In another embodiment, the coil may be disposed on the housing, and the magnet may be disposed on the bobbin.

In addition, the lens driving device for AF for AF feedback driving may further include a sensing magnet disposed on the bobbin, an AF position sensor (e.g., a hall sensor) disposed on the housing, a circuit board disposed or mounted on the housing and/or the base, and a circuit board on which the AF position sensor is disposed and disposed or mounted to the housing and/or base. In another embodiment, the AF position sensor may be disposed on the bobbin, and the sensing magnet may be disposed on the housing.

The camera module according to another embodiment may include a housing coupled to a lens or a lens barrel 400 instead of the lens driving device 100 of FIG. 2 and fixing the lens or the lens barrel 400. The housing may be coupled or attached to an upper surface of a holder 600. The housing attached or fixed to the holder 600 may not be moved, and the position of the housing may be fixed while being attached to the holder 600.

The circuit board may be electrically connected to the coil and the AF position sensor, a driving signal may be provided to each of the coil and the AF position sensor through the circuit board, and the output of the AF position sensor may be transmitted to the circuit board.

The holder 600 may be disposed under the base 210 of the lens driving device 100.

The filter 610 is mounted on the holder 600, and the holder 600 may include a seating part 500 on which the filter 610 is seated.

An adhesive member 612 may couple or attach the base 210 of the lens driving device 100 to the holder 600. For example, a third adhesive member 612 may be disposed between a lower surface of the base 210 and an upper surface of the holder 600, and may adhere them to each other.

The third adhesive member 612 may serve to inhibit foreign substances from being introduced into the lens driving device 100 in addition to the above-described adhesive role. For example, the third adhesive member 612 may be an epoxy, a thermosetting adhesive, or an ultraviolet curable adhesive.

The filter 610 may be disposed in the seating part 500 of the holder 600.

The seating part 500 of the holder 600 may include a protrusion (not shown) protruding from an upper surface of the holder 600, but is not limited thereto. In another embodiment, the seating part may be in the form of a recess, a cavity, or a hole recessed from the upper surface of the holder 600.

The protrusion of the seating part 500 may serve to inhibit a lower end of the lens or the lens barrel 400 from contacting or colliding with the filter 610 (or/and the blocking member 1500).

The protrusion of the seating part 500 may be formed to protrude along the side surface of the filter 610 in the optical axis direction. For example, the protrusion may be disposed around the side surface of the filter 610 to surround the side surface of the filter 610.

An inner surface of the protrusion may be provided to face the side surface of the filter 610, and they may be spaced apart from each other. This is to secure a processing tolerance for easily mounting the filter 610 inside the seating part 500 of the holder 600.

In addition, an upper surface of the protrusion of the seating part 500 may be located higher than the upper surface of the filter 610 in the optical axis direction. This is to inhibit the lens or the lower end of the lens barrel 400 from directly colliding with the filter 610 when the lens or the lens barrel 400 is mounted on the lens driving device 100 and moves in the optical axis direction or moves in the direction toward the filter 610 by an external impact.

The shape of the protrusion of the seating part 500 viewed from the upper side may match a shape of the filter 610, but is not limited thereto. In another embodiment, the shape of the protrusion of the seating part 500 may be similar to or different from the shape of the filter 610.

The holder 600 may include an opening 501 formed at a portion where the filter 610 is mounted or disposed so that light passing through the filter 610 may be incident on the image sensor 810.

For example, the opening 501 may pass through the holder 600 in the optical axis direction, and may be expressed by replacing "through hole".

For example, the opening 501 may pass through a center of the holder 600 and may be provided in the seating part 500, and an area of the opening 501 may be smaller than an area of the filter 610.

The holder 600 is disposed on the circuit board 800, and may accommodate the filter 610 therein. The holder 600 may support the lens driving device 100 positioned on an upper side. The lower surface of the base 210 of the lens driving device 100 may be disposed on an upper surface of the holder 600.

For example, the lower surface of the base 210 of the lens driving device 100 may be in contact with the upper surface of the holder 600 and may be supported by the upper surface of the holder 600.

For example, the filter 610 may be disposed in the seating portion 500 of the holder 600.

The filter 610 may serve to block light of a specific frequency band in light passing through the lens barrel 400 from entering the image sensor 810.

For example, the filter 610 may be an infrared cut filter, but is not limited thereto. For example, the filter 610 may be disposed to be parallel to an x-y plane perpendicular to the optical axis OA.

The filter 610 may be attached to the seating part 500 of the holder 600 by an adhesive member (not shown) such as UV epoxy.

The circuit board 800 may be disposed under the holder 600, and the holder 600 may be disposed on the upper surface of the circuit board 800.

The holder 600 may be attached to or fixed to the upper surface of the circuit board 800 by an adhesive member such as an epoxy, a thermosetting adhesive, or an ultraviolet curable adhesive. In this case, the adhesive member may be disposed between the lower surface of the holder 600 and the upper surface of the circuit board 800.

In the circuit board 800, an image sensor 810 may be disposed in a region corresponding to the opening 501 of the holder 600. For example, the image sensor 810 may be attached or fixed on the circuit board 800 overlapping the opening 501 of the holder 600 in the optical axis direction.

The reinforcing plate 900 is disposed under the circuit board 800.

In this case, the circuit board 800 may include a wire part 805. Specifically, the circuit board 800 may include a wire part 805 disposed in a region corresponding to the opening 501 of the holder 600. In addition, the wire part 805 may overlap a region on the upper surface of the circuit board 800 in which the image sensor 810 is disposed in the optical axis direction.

The wire part 805 may be attached to the circuit board 800 through a thermocompression bonding method or an ultrasonic bonding method. Specifically, the wire part 805 may be a wire bonded on the first pad 802 of the circuit board 800. The wire part 805 is not electrically connected to the image sensor 810. That is, the wire part 805 is not for a signal transmission function between the circuit board 800 and the image sensor 810, but may function to support the image sensor 810 when the image sensor 810 is attached.

At this time, the wire part 805 is formed by bonding a wire on the pad 802 of the circuit board 800 in the embodiment, and the process of attaching the image sensor 810 is performed in a state in which the image sensor 810 is positioned on the formed wire part 805. In this case, a specific region of the lower surface of the image sensor 810 may be supported by the wire part 805 in the process of attaching the image sensor 810. Accordingly, the embodiment can minimize the occurrence of warpage of the image sensor 810, and accordingly, reliability may be improved.

The wire part 805 may protrude from the circuit board 800 in the optical axis direction. For example, the wire part 805 may be positioned higher than an upper surface of an uppermost layer in the multi-layer structure of the circuit board 80.

Meanwhile, the image sensor 810 supported and attached by the wire part 805 may be electrically connected to the circuit board 800 through a connecting wire 21. For example, the connecting wire 21 may connect a terminal 813 of the image sensor 810 and a terminal 803 of the circuit board 800 to each other.

That is, the lower surface of the image sensor 810 in the embodiment is in contact with the wire part 805, the terminal 813 of the upper surface is connected to the connecting wire 21. In this case, the wire part 805 and the connecting wire 21 may be formed using a wire of the same material. Alternatively, the wire part 805 and the connecting wire 21 may be formed using wires of different materials. That is, the wire part 805 is used for support of the image sensor 810, rather than an electrical signal transmission function. Accordingly, the wire part 805 may include a metal material that can be bonded on the pad 802 of the circuit board 800 through bonding while having a certain strength regardless of signal transmission performance. For example, the wire part 805 may include a wire made of at least one of gold (Au), copper (Cu), aluminum (Al), and silver (Ag). Meanwhile, the connecting wire 21 serves as a wiring electrically connecting the circuit board 800 and the image sensor 810. Accordingly, the connecting wire 21 may include a metal wire made of a material capable of minimizing transmission loss while enabling signal transmission.

A reinforcing plate 900 is a plate-shaped member having a predetermined thickness and hardness, and can stably support the circuit board 800 and further the image sensor 810, and can suppress damage to the circuit board 800 or the image sensor 810 due to impact or contact from the outside.

In addition, the reinforcing plate 900 may improve the heat dissipation effect of dissipating heat generated from the image sensor 810 and the circuit board 800 to the outside.

For example, the reinforcing plate 900 may be formed of a metal material having high thermal conductivity, for example, SUS, aluminum, etc., but is not limited thereto. In another embodiment, the reinforcing plate 900 may be formed of glass epoxy, plastic, or synthetic resin.

In addition, the reinforcing plate 900 may serve as a ground for protecting the camera module from ESD (Electrostatic Discharge Protection) by being electrically connected to a ground terminal of the circuit board 800.

A pad 802 of the circuit board 800 may include a surface treatment layer (not shown) on its upper surface. For example, the pad 802 may include a surface treatment layer including nickel (Ni) on its surface. At this time, the wire part 805 is bonded on the pad 802. Accordingly, the surface treatment layer of the pad 802 may include a metal layer having good bonding properties to the wire part 805. For example, when the wire part 805 is a copper wire, the surface treatment layer of the pad 802 may include a nickel layer. For example, when the wire part 805 is a gold (Au) wire, the surface treatment layer of the pad 802 may include a first surface treatment layer containing nickel (Ni) and a second surface treatment layer containing palladium (Pd). The surface treatment layer of the pad 802 may be a metal layer capable of improving bonding properties with the wire part 805 while inhibiting oxidation of the pad 802.

The image sensor 810 may be a portion on which the light passing through the filter 610 is incident to form an image included in the light.

The circuit board 800 may be provided with various circuits, elements, control units, etc. in order to convert an image formed on the image sensor 810 into an electrical signal and transmit it to an external device. A circuit pattern electrically connected to an image sensor and various devices may be formed on the circuit board 800.

The holder 600 may be represented by replacing a first holder, and the circuit board 800 may be represented by replacing a second holder.

The image sensor 810 may receive an image included in light incident through the lens driving device 100 and convert the received image into an electrical signal.

The filter 610 and the image sensor 810 may be spaced apart to face each other in the optical axis OA direction or the first direction.

In addition, the protrusion 500a of the holder 600 may be disposed to face the filter 610 in the optical axis direction.

The blocking member 1500 may be disposed on the upper surface of the filter 610. The blocking member 1500 may be replaced with a "masking unit".

For example, the blocking member 1500 may be disposed on a corner region of the upper surface of the filter 610, and serve to block at least a portion of light incident toward the corner region of the filter 610 through the lens or lens barrel 400 from passing through the filter 610. For example, the blocking member 1500 may be coupled or attached to the upper surface of the filter 1610.

For example, the filter 610 may be formed in a rectangular shape viewed in the optical axis direction, and the blocking member 1500 may be formed symmetrically with respect to the filter 610 along each side of the upper surface of the filter 610.

In this case, the blocking member 1500 may be formed to have a constant width at each side of the upper surface of the filter 1610.

The blocking member 1500 may be formed of an opaque material. For example, the blocking member 1500 may be provided in the form of an opaque adhesive material applied to the filter 610 or in the form of a film attached to the filter 610.

The filter 610 and the image sensor 810 may be disposed to face each other in the optical axis direction, and the blocking member 1500 may at least partially overlap the terminal 803 and/or the connecting wire 21 disposed on the circuit board 800 in the optical axis direction.

The connecting wire 21 and the terminal 803 may be formed of a conductive material, for example, gold (Au), silver (Ag), copper (Cu), a copper alloy, etc., and such a conductive material may have a property of reflecting light. The light passing through the filter 610 may be reflected by the terminal 803 and the connecting wire 21 of the circuit board 800, and an instantaneous flashing, that is, a flare phenomenon may occur by this reflected light, and such a flare phenomenon may distort an image formed on the image sensor 810 or deteriorate image quality.

The blocking member 1500 is disposed so that at least a portion overlaps with the terminal 803 and/or the connecting wire 21 in the optical axis direction, thereby, it is possible to block the light directed to the terminal 803 of the circuit board 800, and/or the connecting wire 21 among the light passing through the lens or the lens barrel 400, thereby inhibiting the flare phenomenon from occurring, and accordingly, it is possible to inhibit the image formed on the image sensor 810 from being distorted or from deterioration of image quality.

A motion sensor 820 may be mounted or disposed on the circuit board 800, and may be electrically connected to the controller 830 through a circuit pattern provided on the circuit board 800.

The motion sensor 820 outputs rotational angular velocity information by the movement of the camera module 200. The motion sensor 820 may be implemented as a 2-axis or 3-axis gyro sensor or an angular velocity sensor.

A control unit 830 is mounted or disposed on the circuit board 800.

The circuit board 800 may be electrically connected to the lens driving device 100. For example, the circuit board 800 may be electrically connected to the circuit board 250 of the lens driving device 100.

For example, a driving signal may be provided to each of the first coil 120 and the second coil 230 of the lens driving device 100 through the circuit board 800, and a drive signal may be provided to the AF position sensor (or OIS position sensor). Also, the output of the AF position sensor (or OIS position sensor) may be transmitted to the circuit board 800.

The connector 840 is electrically connected to the circuit board 800, and may include a port for electrically connecting to an external device.

A first adhesive member 1750 may be disposed between the circuit board 800 and the image sensor 810, and the image sensor 810 may be attached or fixed on the circuit board 800 by the first adhesive member 1750.

In addition, the second adhesive member 1700 may be disposed between the reinforcing plate 900 and the circuit board 800. The reinforcing plate 900 may be attached or fixed to the lower surface of the circuit board 800 through the second adhesive member 1700, and thus may be connected to the ground of the circuit board 800.

Meanwhile, the circuit board 800 may include a first region overlapping the image sensor 810 in the optical axis direction and a second region other than the first region.

In addition, the image sensor 810 may be supported or fixed to the wire part 805 formed in the first region of the circuit board 800. For example, at least a portion of a lower surface of the image sensor 810 may be in direct contact with the wire part 805. That is, the first adhesive member 1750 in the embodiment may be selectively formed in a region in which the wire part 805 is not disposed among the first region. Accordingly, at least a first portion of the lower surface of the image sensor 810 may be in direct contact with the wire part 805, and at least a second portion may be in direct contact with the first adhesive member 1750. That is, the second portion of the image sensor 810 may be attached or fixed to the first adhesive member 1750 while the first portion of the image sensor is supported by the wire part 805. Accordingly, at least a first portion of the image sensor 810 in an embodiment may be in direct contact with the wire part 805 to minimize warpage of the image sensor 810. In addition, at least a first portion of the image sensor 810 in an embodiment may be in direct contact with the wire part 805 to efficiently transfer heat generated from the image sensor 810 to the outside.

Meanwhile, an area of the image sensor 810 in the embodiment may be larger than an area of the first adhesive member 1750. That is, only a portion of the entire lower surface of the image sensor 810 may contact the first adhesive member 1750. For example, only the central region of the lower surface of the image sensor 810 may selectively contact the first adhesive member 1750.

In this case, the first adhesive member 1750 may be disposed to be spaced apart from the wire part 805 on the circuit board 800. For example, a predetermined separation space may be formed between the wire part 805 and the first adhesive member 1750 on the upper surface of the circuit board 800.

Meanwhile, the first adhesive member 1750 may be an epoxy, a thermosetting adhesive, an ultraviolet curable adhesive, an adhesive film, or the like, but is not limited thereto.

In addition, the second adhesive member 1700 may be an epoxy, a thermosetting adhesive, an ultraviolet curable adhesive, or an adhesive film, but is not limited thereto.

The circuit board 800 will be described in more detail as follows.

The circuit board 800 includes an insulating layer 801, a pad 802, a terminal 803, a protective layer 804 and a wire part 805.

The circuit board 800 includes an insulating layer 801. The insulating layer 801 may include a plurality of layers in the circuit board 800. However, a plurality of insulating layers are schematically represented as one layer for convenience of description in the drawings.

The insulating layer 801 may be a rigid insulating layer. For example, the circuit board 800 may include a rigid region including a rigid insulating layer and a flexible region including a flexible insulating layer. In addition, a region in which the image sensor 810 is disposed is a rigid region having a certain strength in the circuit board 800, and accordingly, the insulating layer 801 may also be a rigid insulating layer. For example, the insulating layer 801 may include a rigid insulating layer having greater strength or greater hardness than the flexible insulating layer, for example, a prepreg. The insulating layer 801 may be replaced with an insulating film or an insulating film.

A pattern layer may be formed on the upper surface of the insulating layer 801. The pattern layer may include a pad 802 and a terminal 803 disposed on an upper surface of the insulating layer 801. The terminal 803 is electrically connected to the image sensor 810, and thus may transmit a signal to the image sensor 810 or receive a signal transmitted from the image sensor 810. Accordingly, it can be said that the terminal 803 is an effective pattern.

In addition, the pattern layer may include a pad 802 disposed on the upper surface of the insulating layer 801. The pad 802 does not function to transmit an electrical signal, and allows the wire part 805 to be attached through bonding. That is, the wire part 805 may be attached to a metal material having good bonding property through bonding. Accordingly, a pad 802 may be selectively formed on a region of the upper surface of the insulating layer 801 where the wire part 805 is to be disposed. The pad 802 is not electrically connected to the image sensor 810, and thus may be referred to as a dummy pattern. Here, not being electrically connected may mean that a substantially effective signal is not transmitted through the corresponding pattern.

The pad 802 may be formed in a region overlapping the image sensor 810 disposed thereon in the optical axis direction.

Also, the terminal 803 may be spaced apart from the pad 802 and be formed in a region that does not overlap the image sensor 810 in the optical axis direction. In this case, the terminal 803 is electrically connected to the terminal of the image sensor 810 through wire bonding, and accordingly, the connecting wire 21 may be formed in a region that does not overlap with the image sensor 810 in the optical axis direction so that the bonding process of the connecting wire 21 may be smoothly performed.

The pad 802 and the terminal 803 may be formed of at least one metal material selected from gold (Au), silver (Ag), platinum (Pt), titanium (Ti), tin (Sn), copper (Cu) and zinc (Zn). In addition, the pad and the terminal 803 may be formed of a paste or solder paste including at least one metal material selected from gold (Au), silver (Ag), platinum (Pt), titanium (Ti), tin (Sn), copper (Cu), and zinc (Zn) having excellent bonding strength. In addition, the pad 802 and the terminal 803 may include at least one surface treatment layer formed of a metal material having high wire bondability.

The terminal 803 and the pad 802 are possible by an additive process, a subtractive process, a Modified Semi Additive Process (MSAP) and SAP (Semi Additive Process) method, etc., which is a typical printed circuit board manufacturing process, detailed description will be omitted here.

A protective layer 804 is disposed on the insulating layer 801. The protective layer 804 may protect the surface of the insulating layer 801 by covering and protecting a pattern layer that should not be exposed to the outside among the pattern layers disposed on the insulating layer 801. The protective layer 804 may include solder resist. That is, the protective layer 804 may be a solder resist layer.

The protective layer 804 has an opening exposing an upper surface of the pad 802 and the terminal 803 disposed on an upper surface of the insulating layer 801. Accordingly, at least a portion of upper surfaces of the pad 802 and the terminal may be exposed through the opening of the protective layer 804.

Meanwhile, the upper surface of the pad 802 exposed through the opening of the protective layer 804 may be a region to which the wire part 805 is bonded. In addition, the upper surface of the terminal 803 exposed through the opening of the protective layer 804 may be a region to which the connecting wire 21 is bonded.

In addition, the connecting wire 21 functions to electrically connect different components to each other, and thus both ends are connected to each other with different components. For example, one end of the connecting wire 21 is connected to the terminal 803 of the circuit board 800, and the other end of the connecting wire 21 is connected to the terminal 813 of the image sensor 810.

Alternatively, the wire part 805 functions to support the image sensor 810, and thus both ends may be connected to one pad 802. That is, the wire part 805 may have one end and the other end connected to the pad 802, and have a height corresponding to a length between the one end and the other end, and may be disposed to protrude above the pad 802.

Meanwhile, an opening of the protective layer 804 may not be formed in a region where the first adhesive member 1750 is to be disposed. Accordingly, the first adhesive member 1750 may be formed on the protective layer 804 to fix or attach the image sensor 810.

An uppermost end of the wire part 805 may be positioned higher than an upper surface of the protective layer 804. That is, a lowermost end of the wire part 805 may be positioned higher than a lower surface of the protective layer 804.

Meanwhile, a plurality of the pads 802 may be formed to be spaced apart from each other in the insulating layer 801. For example, the pad 802 may include a first pad 802-1, a second pad 802-2, a third pad 802-3, and a fourth pad 802-4.

Also, the wire part 805 may include a plurality of sub wire parts respectively disposed on the first to fourth pads 802-1, 802-2. 802-3. 802-4. For example, the wire part 805 may include a first sub wire part 805a disposed on the first pad 802-1, a second sub wire part 805b disposed on the second pad 802-2, a third sub wire part 805c disposed on the third pad 802-3, and a fourth sub wire part 805d disposed on the fourth pad 802-4.

Accordingly, different regions of the lower surface of the image sensor 810 in an embodiment may be supported through the first sub wire part 805a, the second sub wire part 805b, the third sub wire part 805c, and the fourth sub wire part 805d, which are spaced apart from each other. Accordingly, the embodiment can support the image sensor 810 more stably, and thus can minimize the warpage phenomenon. In addition, the heat generated from the image sensor 810 in the embodiment may be provided by branching it to different paths through a plurality of sub wire parts separated from each other, and accordingly, heat dissipation performance may be improved.

Hereinafter, the structure of the wire part 805 will be described in detail.

Referring to FIG. 5, the wire part 805 may include a bump portion 805-1, a first extension portion 805-2, a second extension portion 805-3, and a third extension portion 805-4 and a fourth extension portion 805-5. As such, the wire part 805 may be formed using a metal wire having a specific thickness.

The bump portion 805-1 may be bonded on the pad 802 of the circuit board 800. The bump portion 805-1 may be a portion initially formed in the process of forming the wire part 805 on the upper surface of the pad 802. That is, the bump portion 805-1 may be a portion formed to have a predetermined width W1 and a predetermined height H2 by pressing while placing the wire on the upper surface of the pad 802 and performing bonding in the pressed state. The bump portion 805-1 may be referred to as a body portion of the wire part 805. Specifically, the bump portion 805-1 may be a portion in which the metal wire is clumped as bonding is performed while pressing the metal wire on the pad 802.

In the first embodiment, the bump portion 805-1 may have a rectangular shape in a vertical cross section. The bump portion 805-1 may have a first width W1. The first width W1 of the bump portion 805-1 may be 80 μm to 100 μm. When the first width of the bump portion 805-1 is less than 80 μm, a contact area between the wire part 805 and the pad 802 may be reduced, and thus the bonding force between the wire part 805 and the pad 802 may be reduced. In addition, when the first width W1 of the bump portion 805-1 is greater than 100 um, the overall volume of the wire part 805 increases, and accordingly, as the length of the wire used increases, the manufacturing cost may increase.

The bump portion 805-1 may have a second height H2. For example, the bump portion 805-1 may have a second height H2 between 10 μm and 30 μm. When the height of the bump portion 805-1 is lower than 10 μm, a height of the first extension portion 805-2 must increase so that the wire part 805 has a certain height, and accordingly, the overall strength of the wire part 805 may be reduced. Accordingly, the supporting force of the image sensor 810 by the wire part 805 may be reduced. In addition, when the height of the bump portion 805-1 is greater than 30 μm, the overall height of the wire part 805 may increase, and thus the overall height of the camera module may increase. In addition, when the length of the first extension portion 805-2 is reduced in a state where the bump portion 805-1 is made larger than 30 um, the height that can be pressed in the attachment process of the image sensor 810 is reduced, and accordingly, the bonding force of the image sensor 810 may decrease.

The first extension portion 805-2 may extend from an upper surface of the bump portion 805-1 in the optical axis direction. The first extension portion 805-2 may have a thickness and shape corresponding to a metal wire forming the wire part 805. However, a portion of the first extension portion 805-2 in contact with the bump portion 805-1 may have a predetermined width. A width W2 of the portion of the first extension portion 805-2 in contact with the bump portion 805-1 may be 25 μm to 45 μm. The width W2 may mean a width of one end of the first extension portion 805-2 in contact with the bump portion 805-1.

A width of an upper end of the first extension portion 805-2 may correspond to the thickness of the metal wire. Accordingly, the first extension portion 805-2 may have a trapezoidal shape in which the width gradually decreases from one end to the other.

The second extension portion 805-3 may be bent at the other end of the first extension portion 805-2 and extend in a direction different from an extension direction of the first extension portion 805-2. For example, the second extension portion 805-3 may extend in a direction perpendicular to the optical axis direction. For example, the second extension portion 805-3 may extend in a direction corresponding to the arrangement direction of the image sensor 810. The second extension portion 805-3 may be flat. For example, the second extension portion 805-3 may have a shape extending in a horizontal direction to the lower surface of the image sensor 810 by being pressed by the pressing force provided in the attachment process of the image sensor 810. The second extension portion 805-3 may have a first length L1. The first length L1 of the second extension portion 805-3 may be in a range of 10 μm to 30 μm. When the length of the second extension portion 805-3 is less than 10 μm, as the contact portion with the image sensor decreases, the reduction in the degree of warpage of the image sensor may be insignificant. In addition, when the length of the second extension portion 805-3 exceeds 30 μm, the strength of the wire part may not be secured.

In this case, the height H1 of the wire part 805 may mean a height from a lowermost end of the bump portion 805-1 to an uppermost end of the second extension art 805-3. In this case, the height H1 of the wire part 805 may be 30 μm to 50 μm. When the height H1 of the wire part 805 is less than 30 μm, the supporting force of the image sensor 810 by the wire part 805 may decrease. In addition, when the height H1 of the wire part 805 is less than 30 μm, the separation distance between the terminals of the image sensor 810 and the circuit board 800 increases, as a result, the length of the connecting wire 21 may increase, thereby reducing reliability. In addition, when the height H1 of the wire part 805 is greater than 50 μm, the overall height of the camera module may increase.

The third extension portion 805-4 may extend from the other end of the second extension portion 805-3 in the optical axis direction. For example, the third extension portion 805-4 may have a predetermined inclination angle with respect to the optical axis direction, and may extend from the other end of the second extension portion 805-3 to the upper surface of the pad 802.

The fourth extension portion 805-5 may be a portion that extends from the other end of the third extension portion 805-4 and is bonded to the upper surface of the pad 802. The fourth extension portion 805-5 may be an end of the wire part 805 formed in the process of completing bonding of the metal wire. Meanwhile, the third extension portion 805-4 and the fourth extension portion 805-5 may be viewed as one configuration, and accordingly, this may be referred to as the other end of the metal wire extending from the second extension portion 805-3 in the direction of the pad 802 and bonded to the pad 802.

That is, the bump portion 805-1 may be a starting portion at which bonding of a metal wire to form the wire part 805 starts, and the fourth extension portion 805-5 may be an ending portion where bonding of the metal wire is terminated.

Meanwhile, referring to FIG. 6, the wire part 805 may include a bump portion 805-1a, a first extension portion 805-2, a second extension portion 805-3, a third extension portion 805-4, and a fourth extension portion 805-5. In this case, as compared to FIG. 5, a shape of the bump portion 805-1a of the wire part 805 of the second embodiment of FIG. 6 is different. That is, the first extension portion 805-2, the second extension portion 805-3, the third extension portion 805-4, and the fourth extension portion 805-5 of the wire part of the second embodiment is substantially the same as the wire part 805 of the first embodiment. However, the bump portion 805-1a in the second embodiment may have a convex upper surface. That is, the upper surface of the portion to be agglomerated at the portion where the bonding of the metal wire starts may have a convex circular shape, and accordingly, the upper surface of the bump portion 805-1a may be a curved surface having a predetermined curvature. However, the embodiment is not limited thereto, and the shape of the bump portion may be changed according to a bonding method of the metal wire.

Hereinafter, the structure of the circuit board 800, the wire part 805, the first adhesive member 1750, and the image sensor 810 according to the embodiment and the arrangement relationship thereof will be described in detail.

Figure 7:
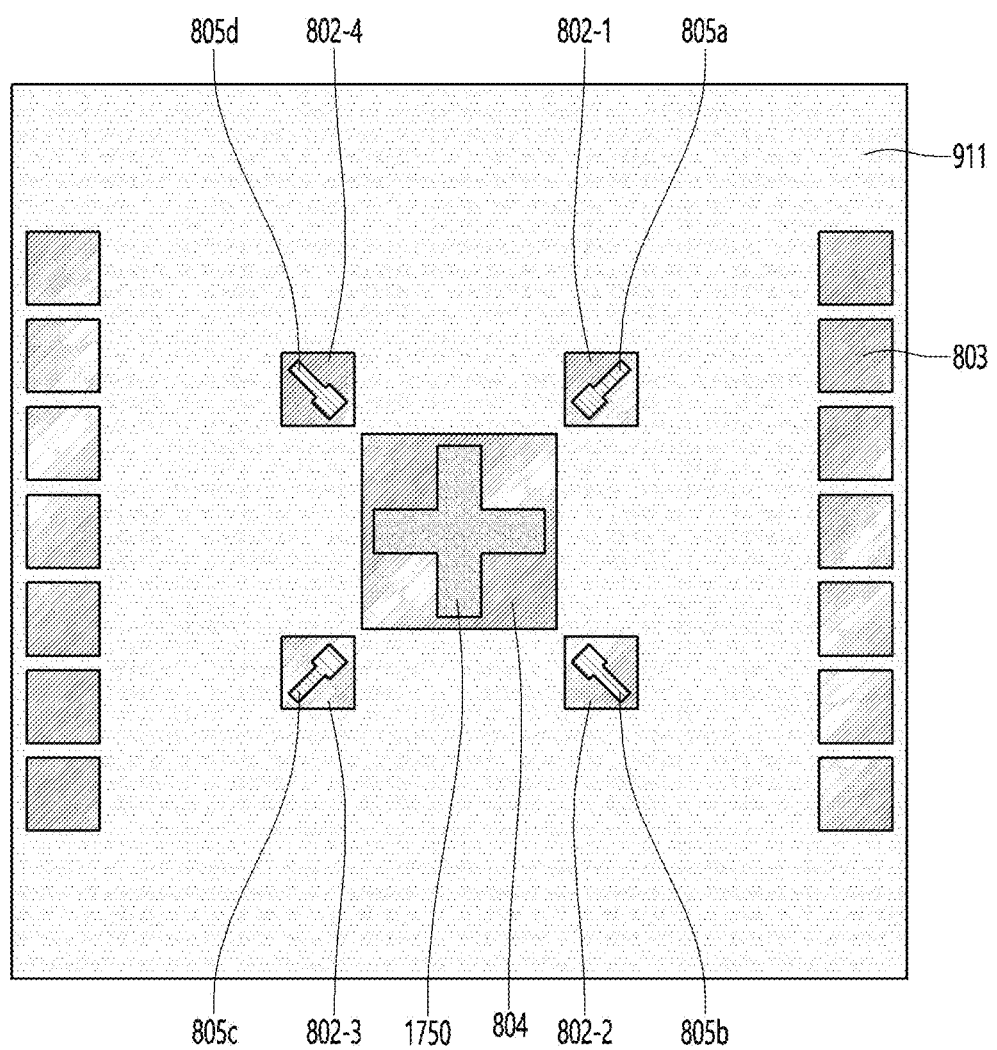
FIG. 7 is a plan view showing a circuit board, a reinforcing plate, a wire part, and a first adhesive member in a state in which the image sensor is removed according to a first embodiment.
Figure 8A:
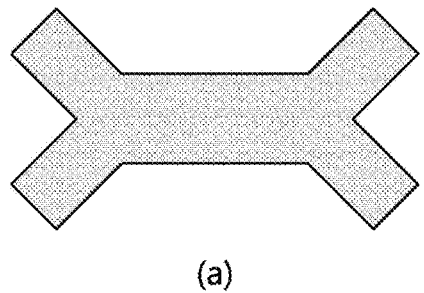
FIGS. 8(a)-8(c) are views showing various embodiments of an arrangement shape of the first adhesive member.
Figure 8B:
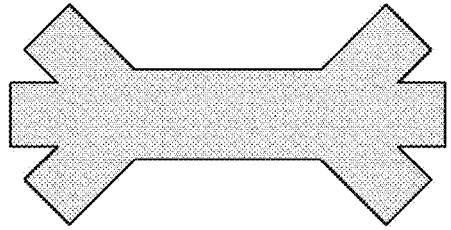
Figure 8C:
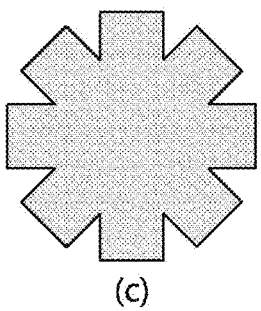
Figure 9:
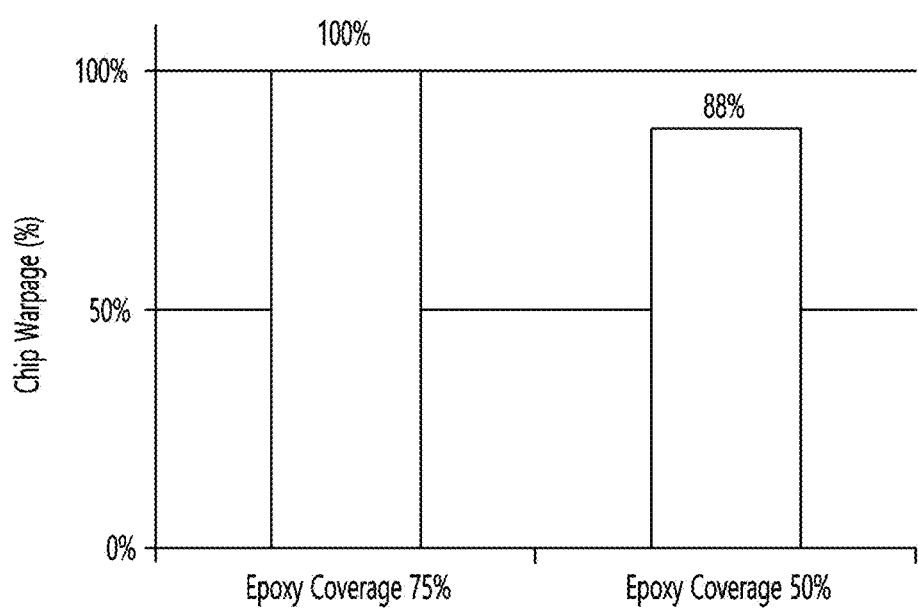
FIG. 9 is a view showing a degree of warpage according to an arrangement area of the first adhesive member.
Figure 10:
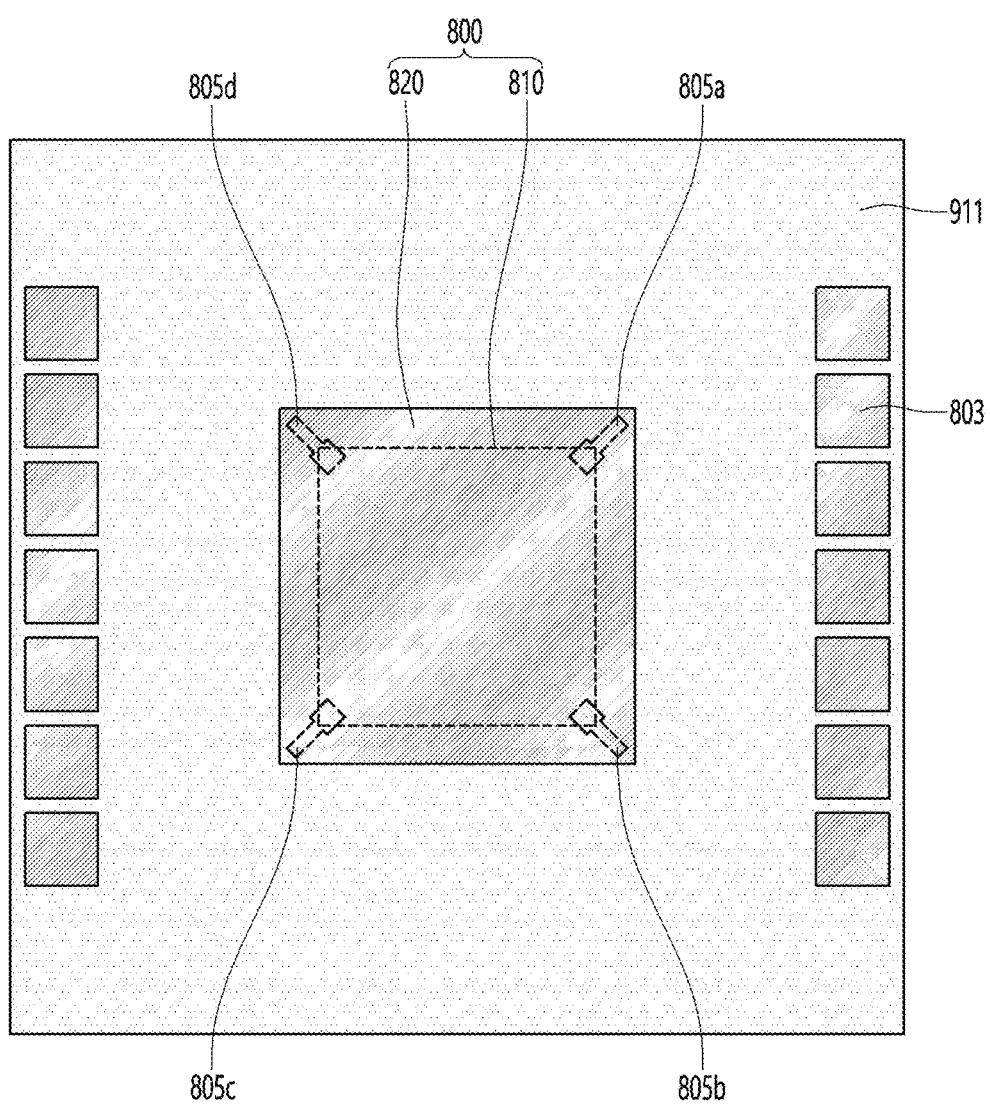
FIGS. 10 and 11 are views for explaining an arrangement relationship of the wire part and the image sensor according to a first embodiment.
Figure 11:
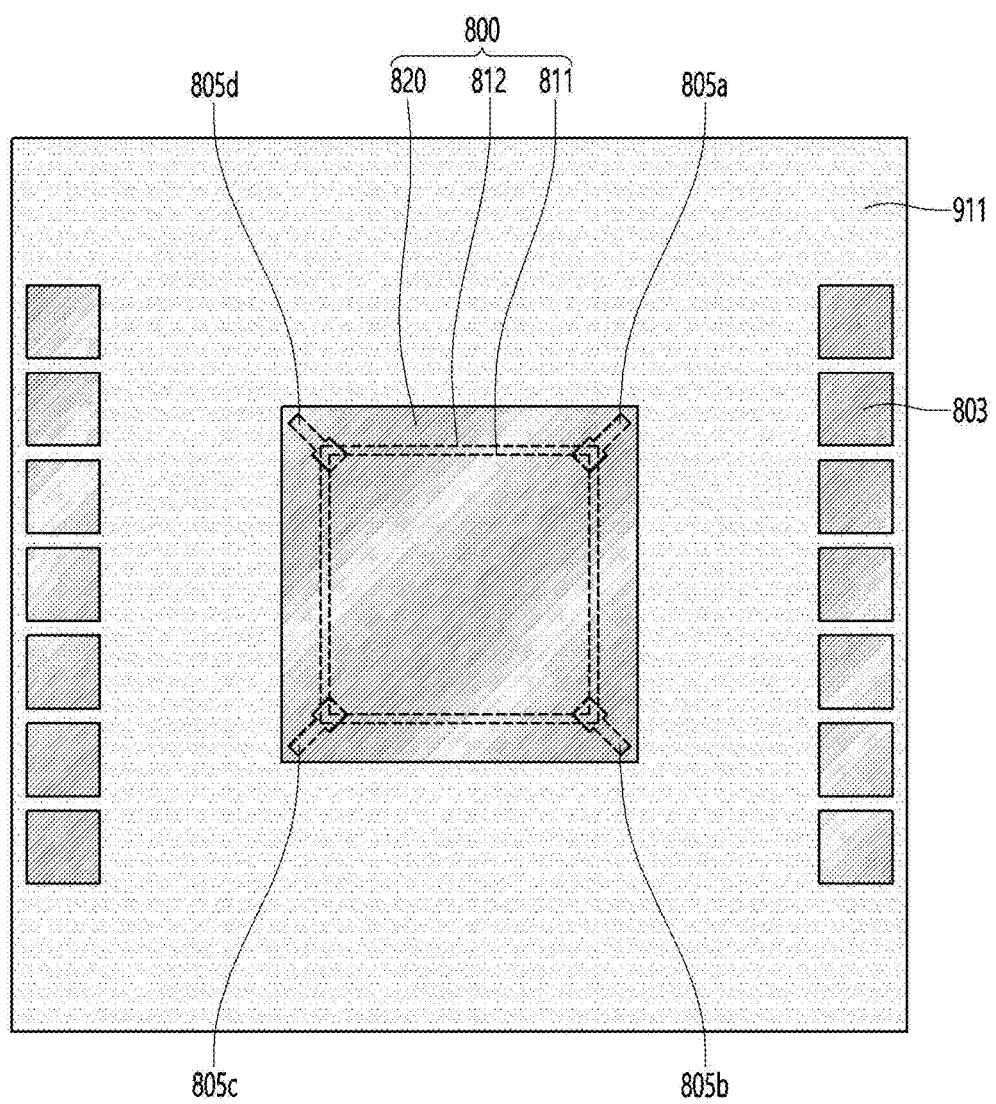

FIG. 7 is a plan view showing a circuit board, a wire part, and a first adhesive member in a state in which the image sensor is removed according to a first embodiment, FIGS. 8(a)-8(c) are views showing various embodiments of an arrangement shape of the first adhesive member, FIG. 9 is a view showing a degree of warpage according to an arrangement area of the first adhesive member, and FIGS. 10 and 11 are views for explaining an arrangement relationship of the wire part and the image sensor according to a first embodiment.

Referring to FIGS. 7 to 11, the circuit board 800 includes a first region and a second region. In addition, the first region may be a region overlapping the image sensor 810 in the optical axis direction.

Also, the first region may be divided into a region in which the wire part 805 is disposed and a region in which the first adhesive member 1750 is disposed.

The first to fourth pads 802-1, 802-2, 802-3, and 802-4 constituting the pad 802 and a first sub wire part 805a, a second sub wire part 805b, a third sub wire part 805c, and a fourth sub wire part 805d bonded to each of the pad 802 may be formed in the first region of the circuit board 800. In this case, the first to fourth pads 802-1, 802-2, 802-3, and 802-4 may be disposed to be spaced apart from each other on the circuit board 800. Accordingly, the first sub wire part 805a, the second sub wire part 805b, the third sub wire part 805c, and the fourth sub wire part 805d may be disposed and spaced apart from each other on the circuit board 800. For example, the pad 802 and the wire part 805 may be respectively located in a region overlapping a corner region of the lower surface of the image sensor 810 in the optical axis direction.

In the embodiment, the image sensor 810 is attached or fixed on the circuit board 800 through the first adhesive member 1750, in a state in which the corner region of the lower surface of the image sensor 810 is supported through the first sub wire part 805a, the second sub wire part 805b, the third sub wire part 805c, and the fourth sub wire part 805d as described above.

For example, the first adhesive member in the comparative example was formed on the circuit board, and thus the image sensor was attached on the first adhesive member. In this case, as the amount of application of the first adhesive member increases, there is a problem in that the degree of warpage of the image sensor increases. In addition, when the first adhesive member is applied only to a portion of the lower region of the image sensor 810, there is no support for supporting the lower surface of the image sensor 810 in the region where the first adhesive member is not applied, and accordingly, there is a problem that warpage occurs.

Unlike this, the first adhesive member 1750 in an embodiment is formed only on a partial region of the lower surface of the image sensor 810, and accordingly, the wire part 805 is disposed in a region where the first adhesive member 1750 is not disposed.

In an embodiment, an area of a lower surface of the image sensor 810 may be greater than an area of an upper surface of the first adhesive member 1750. For example, an area of an upper surface of the first adhesive member 1750 may be less than 80% of an area of a lower surface of the image sensor 810. For example, the area of the upper surface of the first adhesive member 1750 may be less than or equal to 70% of the area of the lower surface of the image sensor 810. For example, the area of the upper surface of the first adhesive member 1750 may be less than or equal to 60% of the area of the lower surface of the image sensor 810. For example, the area of the upper surface of the first adhesive member 1750 may be less than or equal to 50% of the area of the lower surface of the image sensor 810.

Preferably, the area of the upper surface of the first adhesive member 1750 is 50% or less of the area of the lower surface of the image sensor 810. According to this, the arrangement area of the first adhesive member 1750 in the embodiment is reduced compared to the area of the image sensor 810, and accordingly, it is possible to minimize the warpage that increases in proportion to the area of the first adhesive member 1750.

Referring to FIGS. 8(*a*)-8(*c*), the first adhesive member 1750 may have various shapes and may be applied on the protective layer 804 of the circuit board 800. However, the first adhesive member 1750 in the embodiment has a snowflake shape as in FIG. 8(*c*). That is, it was confirmed that a change in the degree of warpage occurs also depending on the application shape of the first adhesive member 1750, and when the first adhesive member 1750 is applied in the shape as shown in FIG. 8(*c*), as a result, it was confirmed that the degree of occurrence of warpage was the lowest.

Also, referring to FIG. 9, when the area of the first adhesive member 1750 is 75% or more of the area of the lower surface of the image sensor 810, the degree of warpage of the image sensor 810 is 100%, when the area of the first adhesive member 1750 is 50% of the area of the lower surface of the image sensor 810, the degree of warpage of the image sensor 810 is 88%. That is, it was confirmed that as the overlapping area of the first adhesive member 1750 and the image sensor 810 decreases, the degree of warpage decreases. However, when the area of the first adhesive member 1750 is reduced without any reference, the adhesive force or fixing force of the image sensor 810 is reduced thereby, and thus, a reliability problem may occur.

In other words, as the area of the first adhesive member 1750 in contact with the image sensor 810 decreases, the influence of the coefficient of thermal expansion is reduced, and thus it can be seen that the degree of warpage is reduced. Accordingly, the area of the portion in contact with the first adhesive member 1750 compared to the total area of the lower surface of the image sensor 810 in the embodiment is 50% or less, and accordingly, the occurrence of warpage of the image sensor 810 is minimized.

As described above, only a partial region of the lower surface of the image sensor 810 in the embodiment is in contact with the first adhesive member 1750, and accordingly, the occurrence of warpage of the image sensor 810 may be minimized, and thus the performance of the image sensor may be improved.

Meanwhile, the first adhesive member 1750 may be formed in the remaining region of the circuit board 800 except for the corner region in the first region. For example, the first adhesive member 1750 may be formed to have various shapes (preferably a snowflake shape) on the first region of the circuit board 800, except for the corner region.

The wire part 805 may be disposed in a region overlapping the corner region of the lower surface of the image sensor 810 in the optical axis direction.

For example, the wire part 805 may include a first sub wire part 805*a* formed in a region overlapping the first corner region of the lower surface of the image sensor 810 in the optical axis direction. The wire part 805 may include a second sub wire part 805*b* formed in a region overlapping the second corner region of the lower surface of the image sensor 810 in the optical axis direction. The wire part 805 may include a third sub wire part 805*c* formed in a region overlapping the third corner region of the lower surface of the image sensor 810 in the optical axis direction. The wire part 805 may include a fourth sub wire part 911 formed in a region overlapping the fourth corner region of the lower surface of the image sensor 810 in the optical axis direction.

Each of the sub wire parts constituting the wire part 805 may be spaced apart from the first adhesive member 1750. For example, the first adhesive member 1750 may not contact the wire part 805. Accordingly, heat generated through the image sensor 810 in an embodiment may be radiated to the outside through a plurality of branched paths, and thus heat dissipation performance may be improved.

Meanwhile, the number of sub wire parts constituting the wire part 805 is four in the above description, but the embodiment is not limited thereto. For example, the wire part 805 may further include a sub wire part formed between adjacent corner regions among the four corner regions.

As described above, the wire part 805 may overlap a specific region of the image sensor 810 in the optical axis direction. Preferably, the second extension portion 805-3 of the wire part 805 substantially supporting the image sensor 810 may overlap a specific region of the image sensor 810 in the optical axis direction.

For example, the image sensor 810 may include a pixel region 811 including a plurality of pixels for detecting an optical image (image information) incident through a lens, and a passivation region 812 other than the pixel region.

In this case, the wire part 805 may be formed so that at least a part of the pixel region 810 overlaps in the corner region of the image sensor 810. For example, the wire part 805 may be formed on the circuit board 800 in a region overlapping the pixel region 811 of the image sensor 810 in the optical axis direction OA.

Specifically, the pixel region of the image sensor 810 may include an active pixel region 811-1 used to detect actual image information, and a dummy pixel region 811-2 other than the active pixel region 811-1. The active pixel region 811-1 may be used to generate image information using incident light. The dummy pixel region 811-2 is not used to generate image information, but may have the same structure as the active pixel region 811-1. That is, the image sensor 810 includes a dummy pixel region 811-2 between the active pixel region 811-1 generating actual image information and the passivation region 812 for protection thereof in order to increase reliability in the generation of image information.

And, the wire part 805 in the embodiment may overlap a corner region of the active pixel region 811-1 of the image sensor in the optical axis direction. That is, the most important region of the image sensor 810 is the active pixel region 811-1, and the flatness of the active pixel region 811-1 substantially determines the performance and operational reliability of the image sensor 810. Accordingly, at least a portion of the active pixel region 811-1 in the embodiment may be supported by the wire part 805.

In addition, the wire part 805 in the embodiment overlaps at least a portion of a corner region of the active pixel region 811-1 in the optical axis direction. Accordingly, a lower surface of the image sensor 810 corresponding to the active pixel region 811-1 in the embodiment may be supported by the wire part 805, so that it is possible to minimize the occurrence of warpage of the active pixel region 811-1 of the image sensor 810.

That is, when the wire part 805 overlaps the active pixel region 811-1 in the optical axis direction, the overall flatness of the active pixel region 811-1 may be maintained, and accordingly, the warpage phenomenon of the image sensor 810 may be minimized.

The second extension portion 805-3 of the wire part 805 may extend in a direction crossing the corners of different regions of the image sensor 810. For example, the second extension portion 805-3 of the wire part 805 may extend in a direction in which the corner of the active pixel region 811-1 of the image sensor 810 and the corner of the passivation region 812 adjacent thereto are connected to each other. For example, the second extension portion 805-3 of the wire part 805 may extend in a diagonal direction therebetween rather than in a length direction or a width direction on the circuit board 800.

Accordingly, the support force of the image sensor 810 by the wire part 805 in the embodiment may be optimized, and thus the occurrence of warpage may be minimized.

Figure 12:
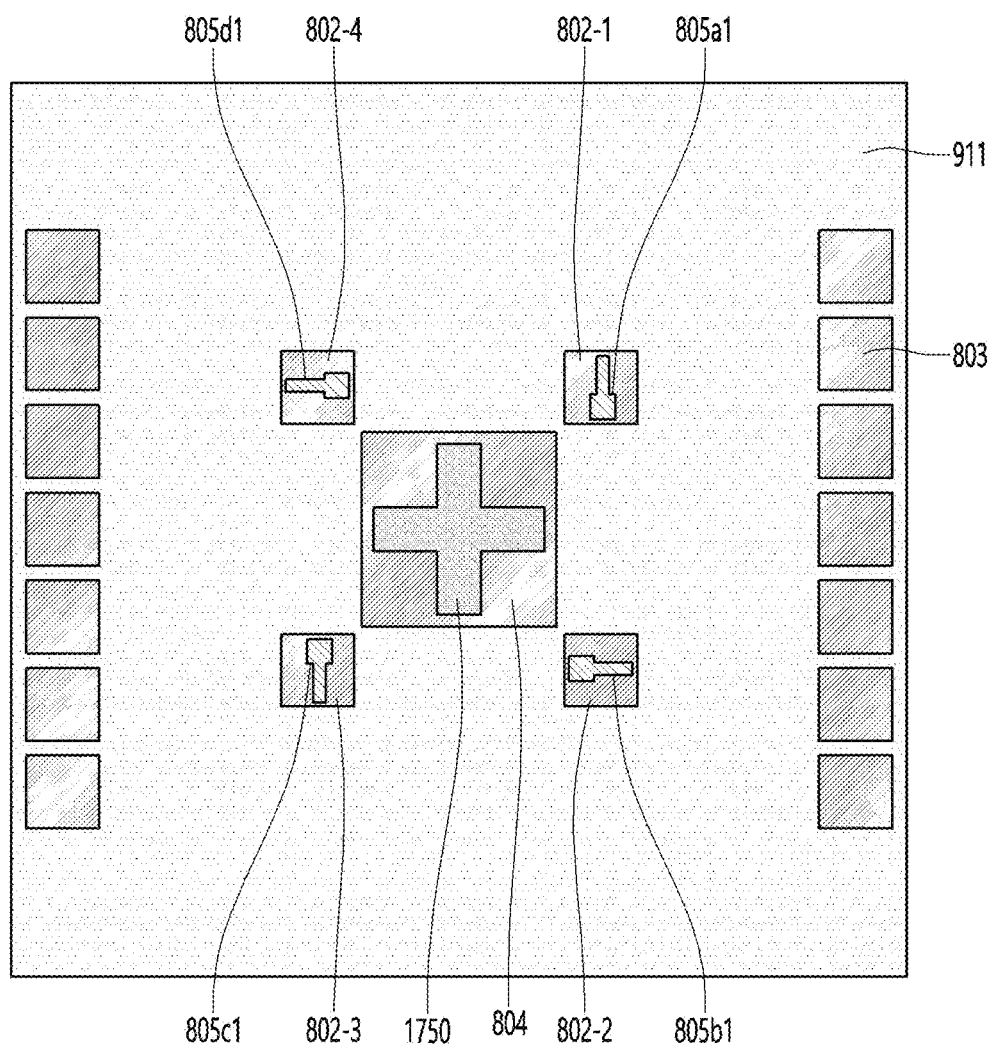
FIG. 12 is a plan view showing a circuit board, a wire part, and a first adhesive member in a state in which the image sensor is removed according to a second embodiment.
Figure 13:
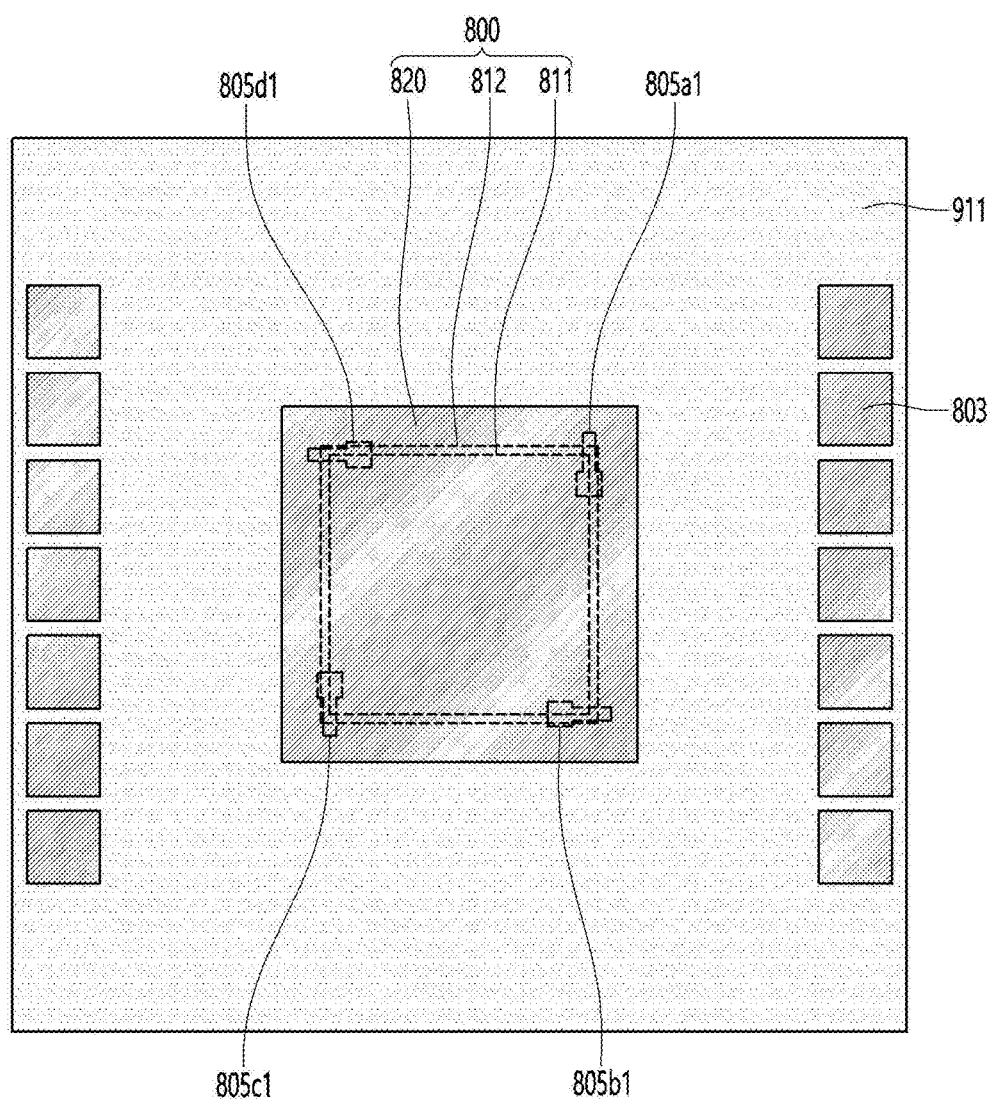
FIG. 13 is a view for explaining an arrangement relationship between the wire part and the image sensor according to the second embodiment.

FIG. 12 is a plan view showing a circuit board, a wire part, and a first adhesive member in a state in which the image sensor is removed according to a second embodiment, and FIG. 13 is a view for explaining an arrangement relationship between the wire part and the image sensor according to the second embodiment.

The second extension portion 805-3 of the wire part 805 in the first embodiment is disposed in a direction to connect the corner regions in a diagonal direction to each other of the plurality of corner regions of the image sensor 810.

Referring to FIGS. 12 and 13, a plurality of sub wire parts 805a, 805b, 805c, and 805d constituting the wire part 805 may be disposed in a direction to connect adjacent corner regions in a plurality of corner regions of the image sensor 810. In this case, each of the second extension portions of the sub wire parts 805a, 805b, 805c and 805d may extend in different directions. For example, the first sub wire part 805a may extend in a direction connecting the first corner region and the fourth corner region of the image sensor 810. For example, the second sub wire part 805b may extend in a direction connecting the first corner region and the second corner region of the image sensor 810. For example, the third sub wire part 805c may extend in a direction connecting the second corner region and the third corner region of the image sensor 810. For example, the fourth sub wire part 805d may extend in a direction connecting the third corner region and the fourth corner region of the image sensor 810.

FIGS. 14(a) and 14(b) are graphs showing a degree of warpage of an image sensor according to a comparative example, and FIGS. 15(a) and 15(b) are graphs showing a degree of warpage of an image sensor including a wire part according to an embodiment.

FIG. 14(a) shows the degree of warpage occurrence for each location of the image sensor of the comparative example, and FIG. 14(b) shows the degree of warpage occurrence by location of the image sensor of the comparative example as a pattern. Referring to FIG. 14, it can be confirmed that the image sensor in the comparative example has an average of about 7.04 µm warpage.

FIG. 15(a) shows the degree of warpage occurrence for each location of the image sensor of the embodiment, and FIG. 15(b) shows the degree of warpage occurrence for each location of the image sensor of the embodiment as a pattern. Referring to FIGS. 15(a) and 15(b), according to the embodiment, when the wire part 805 is applied while minimizing the application area of the first adhesive member, it was confirmed that the image sensor had an average of about 4.42 µm, which was improved compared to the comparative example.

An embodiment includes a circuit board including a wire part. The circuit board is a board on which the image sensor is mounted. In this case, the wire part includes a pad disposed on a first region overlapping the image sensor in the optical axis direction, and a terminal disposed on a second region not overlapping the image sensor in the optical axis direction. And, the wire part is bonded on the pad. In addition, the first region includes a region in which an adhesive member is disposed for attaching or fixing the image sensor. That is, the adhesive member may be selectively disposed on a region in which the wire part is not formed among the first region of the circuit board. In an embodiment, at least a part of the lower surface of the image sensor may be attached or fixed to the circuit board by the adhesive member in a state in which at least a part of the image sensor is in direct contact with and supported by the wire part. In this case, the wire part is not electrically connected to (or separated from) the image sensor. That is, the wire part is not a wire having an electrical signal transmission function, but a wire having a supporting function for supporting the image sensor. Accordingly, at least a part of the image sensor in the embodiment may be in direct contact with and supported by the wire part, thereby minimizing the warpage phenomenon of the image sensor. In addition, heat generated from the image sensor in an embodiment may be efficiently transferred to an outside by allowing at least a part of the image sensor to directly contact the wire part.

In addition, an area of an adhesive member disposed on the lower surface of the image sensor in the embodiment is smaller than an area of the lower surface of the image sensor. According to this, an arrangement area of the adhesive member in the embodiment is reduced compared to the area of the image sensor, and accordingly, the warpage phenomenon of the image sensor, which increases in proportion to the area of the adhesive member, can be minimized.

In addition, a corner region of a lower surface of an active pixel region of the image sensor and the wire part are in direct contact with each other. Accordingly, the embodiment may solve the problem of warping of the active pixel region of the image sensor.

Figure 16:
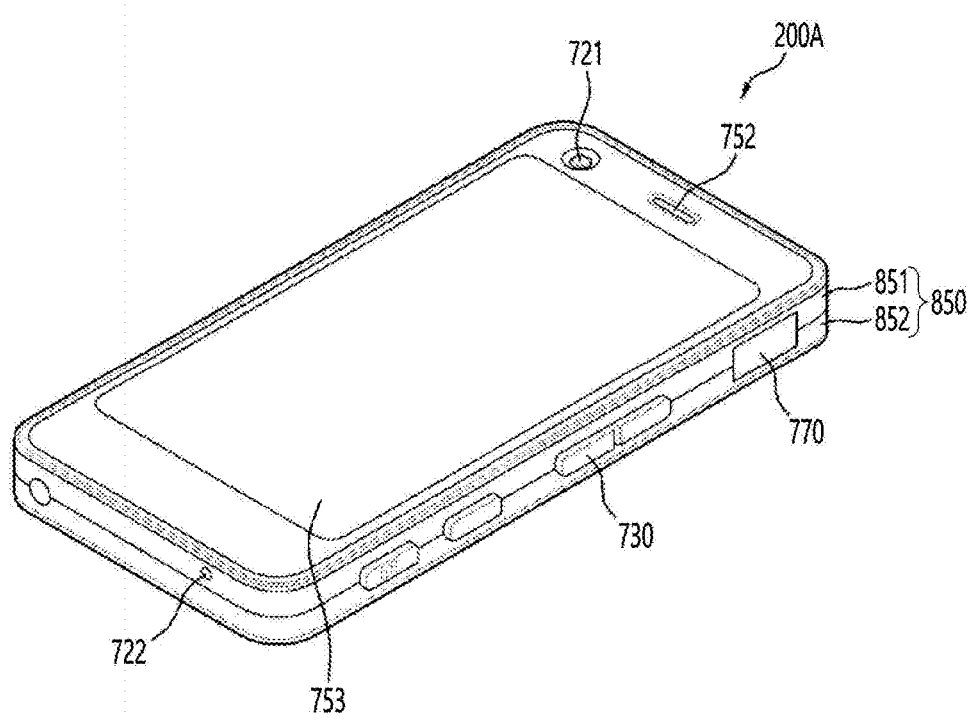
FIG. 16 is a perspective view of a portable terminal according to an embodiment.
Figure 17:
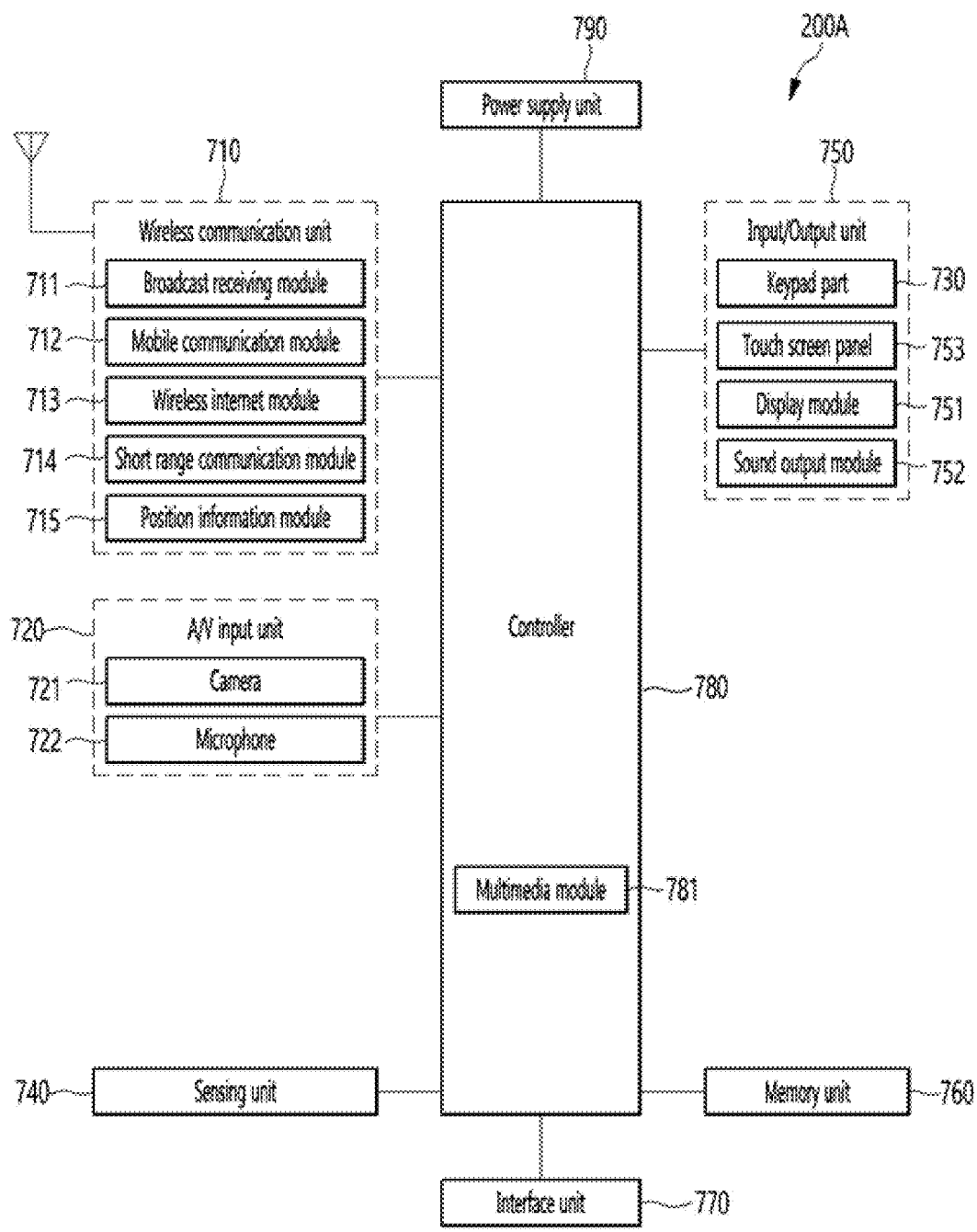
FIG. 17 is a block diagram of the portable terminal shown in FIG. 16.

FIG. 16 is a perspective view of a portable terminal 200A according to an embodiment, and FIG. 17 is a block diagram of the portable terminal shown in FIG. 16.

FIGS. 16 and 17, the portable terminal (200A, hereinafter referred to as "terminal") may include a body 850, a wireless communication unit 710, an A/V input unit 720, and a sensing unit 740, an input/output unit 750, a memory unit 760, an interface unit 770, a control unit 780, and a power supply unit 790.

The body 850 shown in FIG. 16 is in the form of a bar, but is not limited thereto, and there may be various structures such as a slide type, a folder type, a swing type, a swivel type, in which two or more sub-bodies are coupled to be movable relative to each other.

The body 850 may include a case (casing, housing, cover, etc.) forming an exterior. For example, the body 850 may be divided into a front case 851 and a rear case 852. Various electronic components of the terminal may be embedded in a space formed between the front case 851 and the rear case 852.

The wireless communication unit 710 may include one or more modules that enable wireless communication between the terminal 200A and the wireless communication system or between the terminal 200A and the network in which the terminal 200A is located. For example, the wireless communication unit 710 may include a broadcast reception module 711, a mobile communication module 712, a wireless internet module 713, a short-range communication module 714, and a location information module 715.

The A/V (Audio/Video) input unit 720 is for inputting an audio signal or a video signal, and may include a camera 721 and a microphone 722 and the like.

The camera 721 may include a camera module according to the embodiment shown in FIG. 2.

The sensing unit may detect a current state of the terminal 200A, such as an opening/closing state of the terminal 200A, a position of the terminal 200A, a presence or absence of user contact, an orientation of the terminal 200A, acceleration/deceleration of the terminal 200A, etc. and generate a sensing signal for controlling the operation of the terminal 200A. For example, when the terminal 200A is in the form of a slide phone, it is possible to sense whether the slide phone is opened or closed. In addition, it is responsible for sensing functions related to whether the power supply unit 790 is supplied with power, whether the interface unit 770 is coupled to an external device, and the like.

The input/output unit 750 is for generating input or output related to sight, hearing, or touch. The input/output unit 750 may generate input data for operation control of the terminal 200A, and may also display information processed by the terminal 200A.

The input/output unit 750 may include a keypad unit 730, a display module 751, a sound output module 752, and a touch screen panel 753. The keypad unit 730 may generate input data in response to a keypad input.

The display module 751 may include a plurality of pixels whose color changes according to an electrical signal. For example, the display module 751 may include at least of a liquid crystal display, a thin film transistor-liquid crystal display, an organic light-emitting diode, a flexible display, three-dimensional display (3D display).

The sound output module 752 may output audio data received from the wireless communication unit 710 in a call signal reception, a call mode, a recording mode, a voice recognition mode, or a broadcast reception mode, or the like; or audio data stored in the memory unit 760.

The touch screen panel 753 may convert a change in capacitance generated due to a user's touch on a specific region of the touch screen into an electrical input signal.

The memory unit 760 may store a program for processing and control of the controller 780, and may temporarily store input/output data (e.g., phone book, message, audio, still image, photo, video, etc.). For example, the memory unit 760 may store an image captured by the camera 721, for example, a photo or a moving picture.

The interface unit 770 serves as a passage for connecting with an external device connected to the terminal 200A. The interface unit 770 receives data from an external device, receives power and transmits it to each component inside the terminal 200A, or transmits data of the terminal 200A to an external device. For example, the interface unit 770 may include a wired/wireless headset port, an external charger port, a wired/wireless data port, a memory card port, a port for connecting a device having an identification module, and an audio I/O (Input/Output) port, video I/O (Input/Output) port, and an earphone port, and the like.

The controller (controller, 780) may control the overall operation of the terminal 200A. For example, the controller 780 may perform related control and processing for voice calls, data communications, video calls, and the like.

The controller 780 may include a multimedia module 781 for playing multimedia. The multimedia module 781 may be implemented within the controller 180 or may be implemented separately from the controller 780.

The controller 780 may perform a pattern recognition process capable of recognizing a handwriting input or a drawing input performed on the touch screen as characters and images, respectively.

The power supply unit 790 may receive external power or internal power under the control of the control unit 780 to supply power required for the operation of each component.

Although the embodiments of the present invention have been described with reference to the accompanying drawings, those skilled in the art to which the present invention pertains will be understood that the present invention may be implemented in other specific forms without modifying the technical spirit and essential features of the present invention. Therefore, it should be understood that the embodiments described above are illustrative in all aspects and not restrictive.

The invention claimed is:

1. A camera module comprising:
a circuit board; and
an image sensor disposed on the circuit board;
wherein the circuit board includes:
an insulating layer;
a pad disposed on the insulating layer;
a terminal disposed on the insulating layer and spaced apart from the pad;
a protective layer disposed on the insulating layer and including an opening exposing the pad and the terminal;
a wire part disposed on the pad; and
a connecting wire connecting the image sensor and the terminal,
wherein a lower surface of the image sensor is in direct contact with the wire part, and
wherein the wire part is not electrically connected to the image sensor.

2. The camera module of claim 1, comprising:
a first adhesive member disposed between the protective layer and the image sensor.

3. The camera module of claim 2, wherein the first adhesive member is spaced apart from the wire part.

4. The camera module of claim 2, wherein an area of a lower surface of the image sensor is greater than an area of the first adhesive member.

5. The camera module of claim 4, wherein an area of the first adhesive member is 50% or less of the area of the lower surface of the image sensor.

6. The camera module of claim 3, wherein the pad includes a plurality of pads spaced apart from each other,
wherein the wire part includes a plurality of sub wire parts disposed on each of the plurality of pads, and
wherein the first adhesive member is disposed in a space between the plurality of sub wire parts.

7. The camera module of claim 6, wherein the plurality of sub wire parts overlap a corner region of a lower surface of the image sensor in an optical axis direction.

8. The camera module of claim 1, wherein the image sensor includes a pixel region and a passivation region around the pixel region; and wherein the wire part overlaps a lower surface of the pixel region of the image sensor in an optical axis direction.

9. The camera module of claim 8, wherein the pixel region of the image sensor includes:
an active pixel region; and
a dummy pixel region between the active pixel region and the passivation region; and
wherein the wire part overlaps a corner region of the active pixel region in the optical axis direction.

10. The camera module of claim 1, wherein the wire part includes:
a bump portion bonded on the pad;
a first extension portion extending from the bump portion in an optical axis direction;
a second extension portion extending from the first extension portion in a direction perpendicular to the optical axis direction and in direct contact with a lower surface of the image sensor; and
a third extension portion extending from the second extension portion and bonded to the pad.

11. The camera module of claim 6, wherein at least two of the plurality of sub wire parts are disposed on the pads in different directions.

12. The camera module of claim 1, wherein the wire part is provided with a conductive material.

13. The camera module of claim 10, wherein a width of the bump portion is in a range of from 80 um to 100 um, and wherein a height of the bump portion is in a range of from 10 um to 30 um.

14. The camera module of claim 10, wherein a height from a lower surface of the bump portion to an uppermost end of the second extension portion is in a range of from 30 um to 50 um.

15. The camera module of claim 10, wherein a length of the second extension is in a range of from 10 um to 30 um.

16. The camera module of claim 1, wherein one end and an other end of the wire part are in contact with the pad, and
wherein one end of the connecting wire is in contact with the terminal of the image sensor, and an other end of the connecting wire is in contact with the terminal of the circuit board.

17. An optical device comprising:
a main body, a camera module disposed on the main body and configured to photograph an image of a subject, and a display unit disposed on the main body and configured to output the image photographed by the camera module,
wherein the camera module includes:
a circuit board; and
an image sensor disposed on the circuit board;
wherein the circuit board includes:
an insulating layer;
a pad disposed on the insulating layer;
a terminal disposed on the insulating layer and spaced apart from the pad;
a protective layer disposed on the insulating layer and including an opening exposing the pad and the terminal;
a wire part disposed on the pad; and
a connecting wire connecting the image sensor and the terminal,
wherein a lower surface of the image sensor is in direct contact with the wire portion,
wherein the wire part is not electrically connected to the image sensor, and
wherein the connecting wire is electrically connected to the image sensor.

18. The optical device of claim 17, wherein the image sensor includes a pixel region and a passivation region around the pixel region; and
wherein the wire part overlaps a lower surface of the pixel region of the image sensor in an optical axis direction.

19. The optical device of claim 17, wherein the wire part includes:
a bump portion bonded on the pad;
a first extension portion extending from the bump portion in an optical axis direction;
a second extension portion extending from the first extension portion in a direction perpendicular to the optical axis direction and in direct contact with a lower surface of the image sensor; and
a third extension portion extending from the second extension portion and bonded to the pad.

20. The optical device of claim 17, wherein the pad includes a plurality of pads spaced apart from each other,
wherein the wire part includes a plurality of sub wire parts disposed on each of the plurality of pads, and
wherein at least two of the plurality of sub wire parts are disposed on the pads in different directions.

* * * * *